(12) United States Patent
Park et al.

(10) Patent No.: US 12,258,663 B2
(45) Date of Patent: Mar. 25, 2025

(54) APPARATUS AND METHOD OF MANUFACTURING OXIDE FILM AND DISPLAY APPARATUS INCLUDING THE OXIDE FILM

(71) Applicant: LG Display Co., Ltd., Seoul (KR)

(72) Inventors: Jaeyoon Park, Paju-si (KR); JaeHyeon Park, Paju-si (KR); KiHoon Park, Paju-si (KR); PilSang Yun, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 144 days.

(21) Appl. No.: 18/180,585

(22) Filed: Mar. 8, 2023

(65) Prior Publication Data

US 2023/0220547 A1    Jul. 13, 2023

Related U.S. Application Data

(62) Division of application No. 16/254,264, filed on Jan. 22, 2019, now abandoned.

(30) Foreign Application Priority Data

Feb. 14, 2018    (KR) .................. 10-2018-0018599

(51) Int. Cl.
   *C23C 16/455*    (2006.01)
   *C23C 16/40*     (2006.01)
   (Continued)

(52) U.S. Cl.
   CPC ........ *C23C 16/45523* (2013.01); *C23C 16/40* (2013.01); *C23C 16/407* (2013.01);
   (Continued)

(58) Field of Classification Search
   CPC ............ C23C 16/4485; C23C 16/4481; C23C 16/45561
   See application file for complete search history.

(56) References Cited

U.S. PATENT DOCUMENTS

| 4,631,199 A | 12/1986 | Hall et al. |
| 5,474,851 A | 12/1995 | Ganswein |

(Continued)

FOREIGN PATENT DOCUMENTS

| CN | 1592958 A | 3/2005 |
| CN | 102084470 A | 6/2011 |

(Continued)

OTHER PUBLICATIONS

China National Intellectual Property Administration, Office Action, CN Patent Application No. 201910068162.1, Sep. 28, 2022, 15 pages (with concise explanation of relevance).

(Continued)

*Primary Examiner* — Joseph A Miller, Jr.
(74) *Attorney, Agent, or Firm* — Fenwick & West LLP

(57) ABSTRACT

Disclosed are an apparatus and method of manufacturing an oxide film having a uniform composition and thickness. The apparatus includes a lower chamber including a reaction space, a susceptor to support a substrate, a chamber lid including gas injection ports, a gas distribution module between the chamber lid and the susceptor and connected to the gas injection ports, a first source container module comprising a first source gas having a first vapor pressure, a first carrier gas supply module supplying a first carrier gas to the first source container module, a second source container module comprising a second source gas having a second vapor pressure, a force gas supply module supplying a force gas, and a reactant gas supply module supplying a reactant gas.

18 Claims, 6 Drawing Sheets

(51) Int. Cl.
*C23C 16/44* (2006.01)
*C23C 16/448* (2006.01)
*H01L 27/12* (2006.01)

(52) U.S. Cl.
CPC ...... *C23C 16/4412* (2013.01); *C23C 16/4481* (2013.01); *C23C 16/4485* (2013.01); *C23C 16/45561* (2013.01); *H01L 27/1262* (2013.01)

(56) References Cited

U.S. PATENT DOCUMENTS

| | | | |
|---|---|---|---|
| 6,143,081 | A | 11/2000 | Shinriki et al. |
| 6,555,165 | B2 | 4/2003 | Takeshima |
| 6,911,092 | B2 | 6/2005 | Sneh |
| 7,214,412 | B2 | 5/2007 | Nishiguchi et al. |
| 8,012,794 | B2 | 9/2011 | Ye |
| 8,101,949 | B2 | 1/2012 | Ye |
| 8,188,468 | B2 | 5/2012 | Ohmi et al. |
| 8,258,511 | B2 | 9/2012 | Ye |
| 8,349,669 | B2 | 1/2013 | Ye |
| 8,435,843 | B2 | 5/2013 | Ye |
| 8,809,132 | B2 | 8/2014 | Ye |
| 10,325,937 | B2 | 6/2019 | Lee et al. |
| 2002/0007790 | A1 | 1/2002 | Park |
| 2002/0170484 | A1 | 11/2002 | Katamine et al. |
| 2003/0200925 | A1 | 10/2003 | Vaartstra |
| 2004/0159005 | A1* | 8/2004 | Olander .............. C23C 16/4481 34/92 |
| 2005/0191864 | A1 | 9/2005 | Nishiguchi et al. |
| 2005/0223987 | A1 | 10/2005 | Iwata et al. |
| 2007/0231485 | A1 | 10/2007 | Moffat et al. |
| 2008/0107825 | A1 | 5/2008 | Ishizaka et al. |
| 2010/0001272 | A1 | 1/2010 | Ye |
| 2010/0001274 | A1 | 1/2010 | Ye |
| 2010/0001346 | A1 | 1/2010 | Ye |
| 2010/0139762 | A1 | 6/2010 | Ohmi et al. |
| 2011/0068337 | A1 | 3/2011 | Choi et al. |
| 2011/0197812 | A1 | 8/2011 | Im et al. |
| 2011/0306169 | A1 | 12/2011 | Ye |
| 2012/0112186 | A1 | 5/2012 | Ye |
| 2012/0288994 | A1 | 11/2012 | Ye |
| 2013/0269600 | A1* | 10/2013 | Sato ...................... C23C 16/407 117/89 |
| 2015/0011077 | A1 | 1/2015 | Yamada et al. |
| 2015/0221508 | A1 | 8/2015 | Kurita et al. |
| 2015/0243686 | A1 | 8/2015 | Lee et al. |
| 2015/0292085 | A1 | 10/2015 | Baisl et al. |
| 2016/0240726 | A1 | 8/2016 | He et al. |
| 2019/0237493 | A1 | 8/2019 | Lee et al. |
| 2022/0190003 | A1 | 6/2022 | Lee et al. |

FOREIGN PATENT DOCUMENTS

| | | |
|---|---|---|
| CN | 204464281 U | 7/2015 |
| JP | 2016-506013 A | 2/2016 |
| KR | 10-0868837 B1 | 11/2008 |
| KR | 10-2010-0017554 A | 2/2010 |
| KR | 10-2015-0019623 A | 2/2015 |

OTHER PUBLICATIONS

First Office Action, Korean Intellectual Property Office Patent Application No. 10-2018-0018599, May 12, 2022, 11 pages.
United States Office Action, U.S. Appl. No. 16/254,264, Dec. 12, 2022, 12 pages.
United States Office Action, U.S. Appl. No. 16/254,264, Jul. 18, 2022, 11 pages.
United States Office Action, U.S. Appl. No. 16/254,264, Mar. 24, 2022, ten pages.
United States Office Action, U.S. Appl. No. 16/254,264, Dec. 17, 2021, nine pages.
United States Office Action, U.S. Appl. No. 16/254,264, Nov. 30, 2021, nine pages.
United States Office Action, U.S. Appl. No. 16/254,264, Jul. 8, 2021, ten pages.
United States Office Action, U.S. Appl. No. 16/254,264, Feb. 24, 2021, 11 pages.
United States Office Action, U.S. Appl. No. 16/254,264, Oct. 6, 2020, 11 pages.

* cited by examiner

APPARATUS AND METHOD OF MANUFACTURING OXIDE FILM AND DISPLAY APPARATUS INCLUDING THE OXIDE FILM

CROSS-REFERENCE TO RELATED APPLICATIONS

This application is a divisional of U.S. patent application Ser. No. 16/254,264 filed on Jan. 22, 2019, which claims the benefit of Republic of Korea Patent Application No. 10-2018-0018599 filed on Feb. 14, 2018, each of which is hereby incorporated by reference in its entirety.

BACKGROUND

Field of Technology

The present disclosure relates to an apparatus and method of manufacturing an oxide film and a display apparatus including the oxide film.

Discussion of the Related Art

An oxide film, an organic metal oxide film, or a metal oxide film (hereinafter each referred to as an oxide film) is used as a passivation layer, a transparent conductive layer, or a semiconductor layer provided on a substrate of a display apparatus, a solar cell, or a semiconductor light emitting device. The oxide film may be formed on a substrate through a sputtering deposition method or an metal-organic chemical vapor deposition (MOCVD) method. Recently, research and development are being done on an MOCVD method of uniformly controlling a thickness and a material composition of an oxide film deposited on a substrate and an apparatus of manufacturing an oxide film by using the MOCVD method.

A related art MOCVD method supplies the same carrier gas to a plurality of source supply apparatuses respectively storing different organic metal source materials for forming an oxide film and injects a plurality of source gases supplied from the plurality of source supply apparatuses into a reaction chamber, thereby forming the oxide film on a substrate.

However, the related art MOCVD method needs a process of injecting and purging a source gas for a relatively long time, for depositing (or adsorbing) an oxide film on a substrate having a size corresponding to a fifth generation substrate (for example, 1100 mm×1250 mm) or more to have a uniform composition and thickness, and thus, productivity is reduced due to a low deposition speed. For this reason, it is difficult to apply the related art MOCVD method to a process of manufacturing a large-size substrate (particularly, a process of manufacturing a display apparatus).

Moreover, vapor pressures of a plurality of source gases for forming an oxide film have different values. For example, some of the plurality of source gases may have a vapor pressure of several Torr to tens of Torr, and the other source gases may have a vapor pressure of hundreds of Torr (1 Torr=101325/760 Pa). In a case where an oxide film is formed on a substrate by injecting each of a plurality of source gases having different vapor pressures into a reaction chamber as a carrier gas, it is difficult to finely control an injection rate (or a source flow rate) of each of the plurality of source gases injected into the reaction chamber. For example, in a case where an injection rate of each of the source gases having different vapor pressures is controlled by using the same carrier gas, an injection rate (or a source flow rate) of one source gas injected into the reaction chamber may differ by hundreds of times from an injection rate of another source gas injected there into, and due to this, it is unfeasible to uniformly control the flow rates of source gases, and particularly, it is impossible to control a flow rate and/or a density of a source gas having a vapor pressure of hundreds of Torr.

Therefore, due to the non-uniform injection rates of source gases having different vapor pressures, a composition or a thickness of an oxide film formed on a substrate is non-uniform.

SUMMARY

Accordingly, the present disclosure is directed to providing an apparatus and method of manufacturing an oxide film and a display apparatus including the oxide film that substantially obviate one or more problems due to limitations and disadvantages of the related art.

An aspect of the present disclosure is directed to providing an apparatus and method of manufacturing an oxide film, which form an oxide film, including a plurality of organic metals having different vapor pressures, on a substrate to have a uniform composition and thickness.

Another aspect of the present disclosure is directed to providing a display apparatus including an oxide film having a uniform composition and thickness.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an apparatus for manufacturing an oxide film, and a method of manufacturing an oxide film according to the independent claims. Further embodiments are described in the dependent claims. In one or more embodiments, there is provided an apparatus for manufacturing an oxide film, the apparatus comprising: a lower chamber including a reaction space; a susceptor in the reaction space, the susceptor configured to support a substrate; a chamber lid configured to seal the reaction space, the chamber lid including a first gas injection port and one or more second gas injection ports; a gas distribution module between the susceptor and the chamber lid, the gas distribution module connected to the first gas injection port and the one or more second gas injection ports; a first source container module connected to the first gas injection port, the first source container module comprising a first source gas having a first vapor pressure; a first carrier gas supply module connected to the first source container module, the first carrier gas supply module configured to supply a first carrier gas to the first source container module such that the first source gas is injected into the reaction space via the first gas injection port; a second source container module connected to the first gas injection port, the second source container module comprising a second source gas having a second vapor pressure that is different from the first vapor pressure; a force gas supply module connected to the second source container module, the force gas supply module configured to supply a force gas to a gas path between the second source container module and the first gas injection port such that the second source gas is injected into the reaction space via the first gas injection port; and a reactant gas supply module connected to the one or more second gas injection ports, the reactant gas supply module configured to supply a reactant gas into the reaction space.

In one embodiment, a method of manufacturing an oxide film comprises: generating a first source gas having a first vapor pressure using a first source container module that is connected to a first gas injection port of a process chamber; generating a second source gas having a second vapor pressure different from the first vapor pressure using a second source container module that is connected to the first gas injection port; supplying a first carrier gas to the first source container module such that the first source gas is supplied to the first gas injection port; supplying a force gas to a gas path between the second source container module and the first gas injection port such that the second source gas is supplied to the first gas injection port; supplying a reactant gas to one or more second gas injection ports of the process chamber; supplying a purge gas to the first gas injection port; and distributing the first source gas, the second source gas, the reactant gas, and the purge gas to a substrate in the process chamber.

In addition to the aforesaid objects of the present invention, other features and advantages of the present invention will be described below, but will be clearly understood by those skilled in the art from descriptions below.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
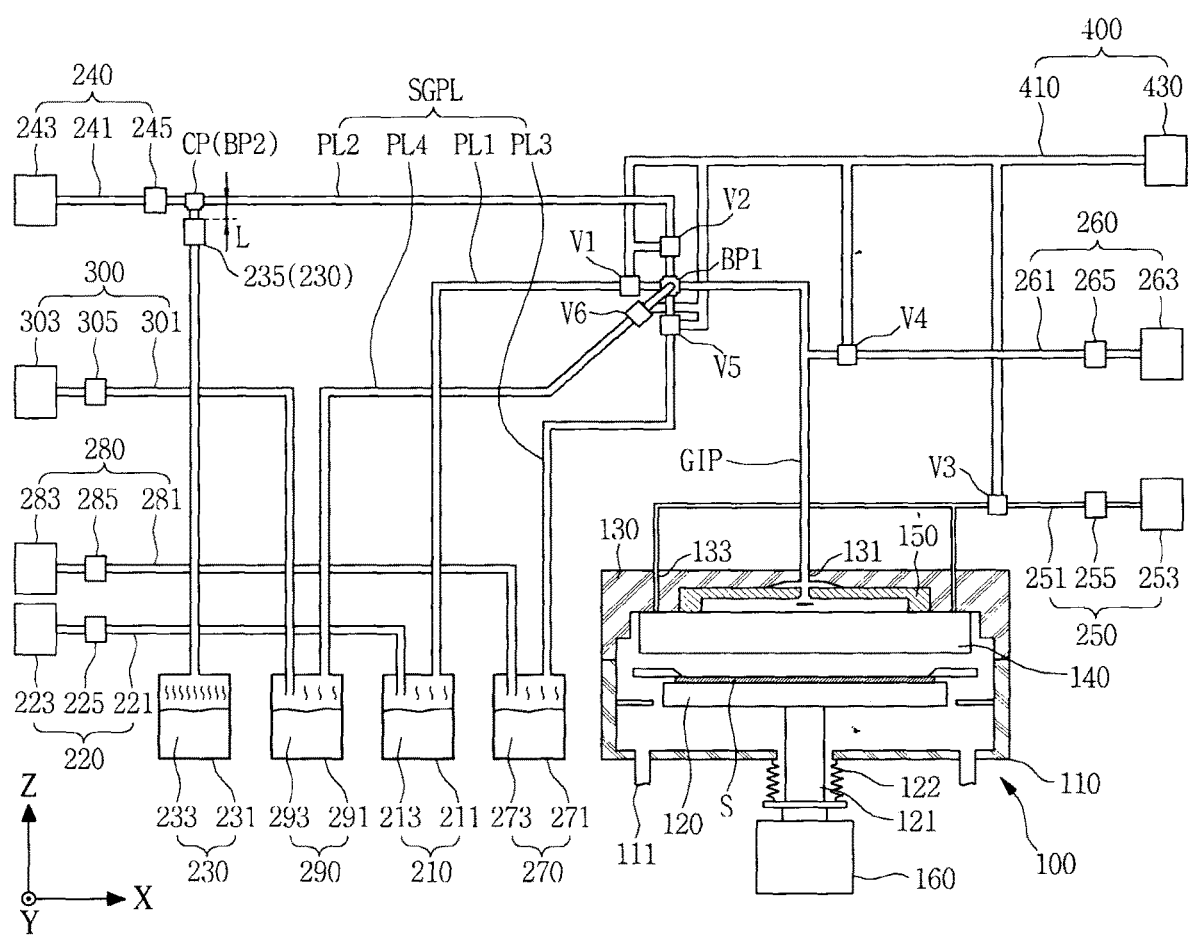
FIG. 1 is a diagram illustrating an apparatus for manufacturing an oxide film according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by the scope of the claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~' and 'next~', one or more other parts may be disposed between the two parts unless 'just' or 'direct' is used.

In describing a time relationship, for example, when the temporal order is described as 'after~', 'subsequent~', 'next~', and 'before~' a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of an apparatus and a method of manufacturing an oxide film and a display apparatus including the oxide film according to the present disclosure will be described in detail with reference to the accompanying drawings. In adding reference numerals to elements of each of the drawings, although the same elements are illustrated in other drawings, like reference numerals may refer to like elements.

Figure 2:
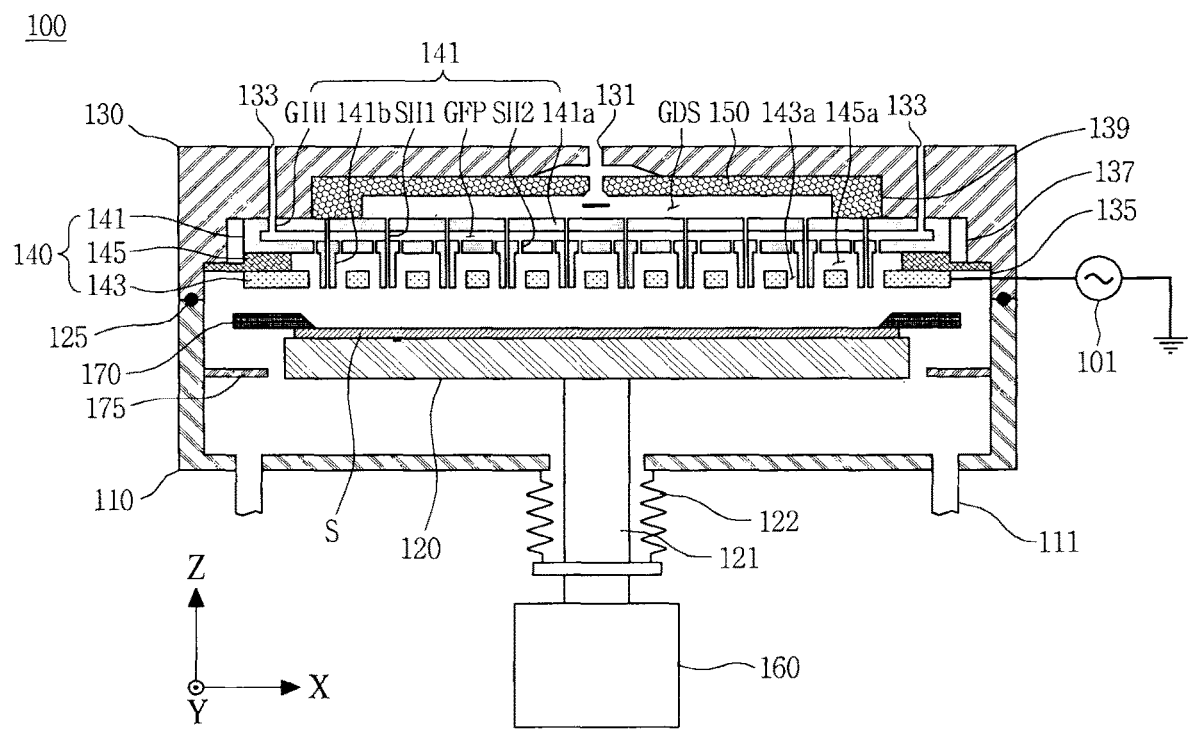
FIG. 2 is a diagram illustrating a process chamber illustrated in FIG. 1 according to an embodiment of the present disclosure.

FIG. 1 is a diagram illustrating an apparatus for manufacturing an oxide film according to an embodiment of the present disclosure, and FIG. 2 is a diagram illustrating a process chamber illustrated in FIG. 1.

Referring to FIGS. 1 and 2, the apparatus (or an oxide film manufacturing apparatus) for manufacturing an oxide film according to an embodiment of the present disclosure may form an oxide film, a metal oxide film, or an organic metal oxide film (hereinafter each referred to as an oxide film) on a substrate S disposed in a reaction space (or a process space), based on a source gas, a reactant gas, and a purge gas. That is, the oxide film manufacturing apparatus according to an embodiment of the present disclosure may form an oxide film having a high density and a high purity on the substrate S through an organic metal chemical vapor deposition (MOCVD) process based on the source gas, the reactant gas, and the purge gas each supplied to the reaction space in a normal low pressure (or low vacuum) atmosphere. An oxide film according to an embodiment may be a passivation layer, a transparent conductive layer, or a semiconductor layer provided on a substrate of a display apparatus, a solar cell, or a semiconductor light emitting device. For example, an oxide film for forming the oxide semiconductor layer may include IGZO(InGaZnO), IGZTO(InGaZnSnO), IZO(InZnO), or IGO(InGaO). For example, an oxide film for forming the transparent conductive layer may include IZO(InZnO). Also, an oxide film for forming the passivation layer may include GZO(GaZnO).

The oxide film manufacturing apparatus according to an embodiment of the present disclosure may include a process chamber 100, a first source container module 210, a first carrier gas supply module 220, a second source container module 230, a force gas supply module 240, a reactant gas supply module 250, and a purge gas supply module 260. Also, the oxide film manufacturing apparatus according to an embodiment of the present disclosure may further include a gas injection pipe GIP and a source gas plumbing line SGPL. Here, the first source container module 210, the first carrier gas supply module 220, the second source container module 230, and the force gas supply module 240 may configure a source gas supply unit, the reactant gas supply module 250 may configure a reactant gas supply unit, and the purge gas supply module 260 may configure a purge gas supply unit.

The process chamber 100 may form an oxide film on the substrate S through a MOCVD process based on a source gas, a reactant gas, and a purge gas each supplied from the source container modules 210 and 230 and the gas supply modules 220, 240, 250, and 260 to the reaction space having a low pressure atmosphere. The process chamber 100 according to an embodiment may form the oxide film on the substrate S through a source gas injecting process, a source gas purging process, a reactant gas injecting process, and a reactant gas purging process. In this case, a time of each of the source gas injecting process, the source gas purging process, the reactant gas injecting process, and the reactant gas purging process may be set to one second or less (for example, 0.3 seconds to 0.7 seconds) so as to have a deposition speed of 20 Å/min (2.0 nm/min) or more for enhancing productivity.

The process chamber 100 according to an embodiment may include a lower chamber 110, a susceptor 120, a chamber lid 130, and a gas distribution module 140.

The lower chamber 110 may provide a reaction space for depositing an oxide film. The lower chamber 110 may include a gate valve through which the substrate S moves in or out. Also, the lower chamber 110 may include an exhaust port 111 for exhausting a gas from the reaction space.

The susceptor 120 may be installed in the reaction space of the lower chamber 110 and may support the substrate S. For example, the susceptor 120 may support one large-size substrate S, and in this case, the one large-size substrate S may have a size of a fifth generation substrate (for example, 1100 mm×1250 mm) or more. As another example, the susceptor 120 may support at least one substrate S, and in this case, the at least one substrate S may have a size less than a fifth generation substrate.

The susceptor 120 according to an embodiment may be supported by a supporter 121 passing through a center of a floor surface of the lower chamber 110. A lower portion of the supporter 121 disposed outside the floor surface of the lower chamber 110 may be sealed by bellows 122 installed outside the floor surface of the lower chamber 110.

The chamber lid 130 may be detachably coupled to an upper portion of the lower chamber 110 with the reaction space there between and may seal the reaction space of the lower chamber 110. A sealing member 125 (for example, an O-ring) may be installed between a wall of the chamber lid 130 and a chamber wall of the lower chamber 110.

The chamber lid 130 according to an embodiment may include a first gas injection port 131 and one or more second gas injection ports 133.

The first gas injection port 131 may vertically pass through a center of the chamber lid 130. The first gas injection port 131 may be supplied with a mixed source gas or a purge gas supplied by the source container modules 210 and 230, the first carrier gas supply module 220, and the force gas supply module 240. Here, the mixed source gas may include a first source gas, a second source gas, a first carrier gas, and a force gas The one or more second gas injection ports 133 may vertically pass through an edge portion of the chamber lid 130. The one or more second gas injection ports 133 may be supplied with a reactant gas from the reactant gas supply module 250. For example, the chamber lid 130 may include four second gas injection ports 133 which are provided in the edge portion of the chamber lid 130 and are spaced apart from the first gas injection port 131 by the same distance, but is not limited thereto. In other embodiments, the chamber lid 130 may include four or more second gas injection ports 133 which are arranged at regular or irregular intervals for uniformly distributing a reactant gas to the substrate S.

The chamber lid 130 according to an embodiment may further include first to third concave portions 135, 137, and 139 provided on a rear surface (or a ceiling surface) thereof facing the susceptor 120.

The first concave portion 135 may be recessed from a rear surface other than a rear edge facing the susceptor 120. The first concave portion 135 may one-dimensionally have a size which is less than that of a rear surface of the chamber lid 130.

The second concave portion 137 may be recessed from a portion other than an edge of the first concave portion 135. The second concave portion 137 may one-dimensionally have a size which is less than that of the first concave portion 135.

The third concave portion 139 may be recessed from a portion other than an edge of the second concave portion 137. The third concave portion 139 may one-dimensionally have a size which is less than that of the second concave portion 137.

The first gas injection port 131 may be exposed at a center of the third concave portion 139, and the one or more second gas injection ports 133 may be exposed at an edge portion of the second concave portion 137.

The gas distribution module 140 may be installed in the chamber lid 130 to face the susceptor 120 and may be connected to the first gas injection port 131 and the one or more second gas injection ports 133. Therefore, a space (i.e., the third concave portion 139) between an inner surface of the chamber lid 130 and the gas distribution module 140 may form a gas diffusion space GDS for uniformly diffusing the mixed source gas or the purge gas, injected through the first gas injection port 131, to the gas distribution module 140. The gas distribution module 140 may distribute a gas, corresponding to a predetermined process cycle, of the mixed source gas supplied via the first gas injection port 131 and the third concave portion 139, the reactant gas supplied via the one or more second gas injection ports 133, and the purge gas supplied via the first gas injection port 131 and the third concave portion 139 to the substrate S. Also, the gas distribution module 140 may generate a plasmatic reactant gas from the reactant gas by using plasma and may distribute the plasmatic reactant gas to the substrate S.

The gas distribution module 140 according to an embodiment may include a shower head 141, a conductive plate 143, and an insulation plate 145.

The shower head 141 may be coupled to the rear surface of the chamber lid 130 facing the susceptor 120 and may be connected to the first gas injection port 131 and the one or more second gas injection ports 133. For example, the shower head 141 may be installed in or fixed to an edge portion of the second concave portion 137 to cover the third concave portion 139 provided on the rear surface of the chamber lid 130.

The shower head 141 according to an embodiment may include a shower body 141a, a plurality of protrusions 141b, a plurality of first shower holes SH1, a plurality of gas flow paths GFP, one or more reactant gas injection holes GIH, and a plurality of second shower holes SH2.

The shower body 141a may be installed in or fixed to an edge portion of the second concave portion 137 to cover the third concave portion 139 provided on the rear surface of the chamber lid 130. The shower body 141a may include a conductive material and may be electrically grounded through the chamber lid 130, and thus, may be referred to as a first electrode or a ground electrode.

The plurality of protrusions 141b may be arranged at certain intervals on a rear surface (or a gas distribution surface) of the shower body 141a facing the susceptor 120 and may protrude to the susceptor 120 to have a certain height from the rear surface of the shower body 141a. The plurality of protrusions 141b may have a predetermined interval, based on the uniformity of a gas distributed to the substrate S. Each of the plurality of protrusions 141b may be used as the first electrode or the ground electrode.

Each of the plurality of first shower holes SH1 may distribute the mixed source gas, supplied via the first gas injection port 131 and the gas diffusion space GDS, to the substrate S. Each of the plurality of first shower holes SH1 according to an embodiment may be provided to vertically pass through the shower body 141a and the plurality of protrusions 141b in a thickness direction Z of the shower body 141a.

The plurality of gas flow paths GFP may be provided inside the shower body 141a to long extend in a first direction X and may be arranged at certain intervals in a second direction Y intersecting the first direction X. In this case, each of the plurality of first shower holes SH1 may be disposed between two adjacent gas flow paths of the plurality of gas flow paths GFP so as not to be connected to each of the plurality of gas flow paths GFP.

The one or more reactant gas injection holes GIH may be provided inside the shower body 141a to overlap the one or more second gas injection ports 133 and intersect one side and/or the other side of each of the plurality of gas flow paths GFP. The one or more reactant gas injection holes GIH may be connected to each of the plurality of gas flow paths GFP and the one or more second gas injection ports 133, and thus, may supply the reactant gas, supplied via the one or more second gas injection ports 133, to each of the plurality of gas flow paths GFP.

Each of the plurality of second shower holes SH2 may be provided adjacent to a corresponding protrusion of the plurality of protrusions 141b and may distribute the reactant gas, supplied through a corresponding gas flow path of the plurality of gas flow paths GFP, to the substrate S. Each of the plurality of second shower holes SH2 according to an embodiment may be provided vertical to the shower body 141a in the thickness direction Z of the shower body 141a so as to be connected to a corresponding gas flow path, which is adjacent to a corresponding protrusion of the plurality of protrusions 141b, of the plurality of gas flow paths GFP. For example, at least four second shower holes SH2 may be disposed near each of the plurality of protrusions 141b.

The conductive plate 143 may be electrically insulated to the shower head 141 and may be disposed on a rear surface of the shower body 141a of the shower head 141. The conductive plate 143 may include a plurality of through holes 143a. Each of the plurality of through holes 143a may be provided to have a size which enables a corresponding protrusion of the plurality of protrusions 141b to be inserted there into and allows a corresponding second shower hole of the plurality of second shower holes SH2 to be exposed and may vertically pass through the conductive plate 143.

The conductive plate 143 according to an embodiment may be electrically connected to a plasma power supply unit 101. The conductive plate 143 may generate plasms around each of the plurality of protrusions 141b, based on a plasma power including a high frequency power or a radio frequency (RF) power selectively supplied from the plasma power supply unit 101 according to a predetermined process cycle, thereby making (activating) the reactant gas, distributed to the substrate S through each of the plurality of second shower holes SH2, plasmatic. Therefore, the conductive plate 143 may be referred to as a second electrode or a plasma electrode for generating plasma. Optionally, the conductive plate 143 may be electrically grounded through the chamber lid 130, and in this case, the shower head 141 may be electrically connected to the plasma power supply unit 101.

The insulation plate 145 may be disposed between the shower head 141 and the conductive plate 143 and may electrically insulate the shower head 141 from the conductive plate 143.

The insulation plate 145 according to an embodiment may include one opening 145a overlapping a gas distribution surface of the shower head 141. In this case, the insulation plate 145 may be coupled (or fixed) to a rear edge of the shower head 141, and the conductive plate 143 may be coupled (or fixed) to a rear surface of the insulation plate 145.

According to another embodiment, the insulation plate 145 may include a plurality of openings respectively overlapping the plurality of through holes 143a provided in the conductive plate 143. In this case, the insulation plate 145 may be coupled (or fixed) to a rear surface of the shower head 141 other than the plurality of protrusions 141b provided in the shower head 141 and the plurality of second shower holes SH2 provided near the plurality of protrusions 141b, and the conductive plate 143 may be coupled (or fixed) to a rear surface of the insulation plate 145 other than the plurality of openings provided in the insulation plate 145.

The process chamber 100 according to an embodiment may further include a gas diffusion member 150.

The gas diffusion member 150 may be disposed in the third concave portion 139 or the gas diffusion space GDS of the chamber lid 130. The gas diffusion member 150 may control a flow of the mixed source gas or the purge gas supplied via the first gas injection port 131 to uniformly diffuse the mixed source gas or the purge gas to the gas diffusion space GDS, thereby allowing the mixed source gas or the purge gas to be uniformly supplied to the gas distribution module 140. The gas diffusion member 150 may be referred to as a baffle plate.

The process chamber 100 according to an embodiment may further include a susceptor driving apparatus 160, an edge frame 170, and a frame supporting part 175.

The susceptor driving apparatus 160 may raise or lower the susceptor 120, based on a process sequence corresponding to an oxide film. The susceptor driving apparatus 160 may raise or lower the supporter 121 coupled to the susceptor 120.

The edge frame 170 may cover a front edge portion, including a front edge portion of the substrate S safely disposed in (or supported by) the susceptor 120, of the susceptor 120. The edge frame 170 may define a deposition region of an oxide film deposited on the substrate S and may prevent a deposited material from being deposited on the substrate S, the susceptor 120, and the lower chamber 110 other than the deposition region of the substrate S. When the susceptor 120 with the substrate S safely disposed therein is raised to a process position by the susceptor driving apparatus 160, the edge frame 170 may be raised along with the susceptor 120 with being disposed on the susceptor 120.

The frame supporting part 175 may be installed on a chamber wall of the lower chamber 110 and may support the edge frame 170 while the substrate S is being loaded/unloaded. The edge frame 170 may be supported by the frame supporting part 175 while the susceptor 120 is being lowered from a process position to a loading/unloading position by the susceptor driving apparatus 160, and thus, may be separated from the susceptor 120 lowered to the loading/unloading position.

The gas injection pipe GIP may be connected to the first gas injection port 131 of the chamber lid 130.

The source gas plumbing line SGPL may be connected between the gas injection pipe GIP and each of the first and second source container modules 210 and 230. The source gas plumbing line SGPL according to an embodiment may include a first source gas supply pipe PL1, a second source gas supply pipe PL2, and a first branch pipe BP1.

The first source gas supply pipe PL1 may be connected between the gas injection pipe GIP and the first source container module 210. One end of the first source gas supply pipe PL1 may be connected to an end of the gas injection pipe GIP through the first branch pipe BP1, and the other end of the first source gas supply pipe PL1 may be connected to the first source container module 210. In this case, the first source gas supply pipe PL1 may have a straight shape, but is not limited thereto. In other embodiments, the first source gas supply pipe PL1 may include at least one bending portion, based on a position of each of the gas injection pipe GIP and the first source container module 210.

The second source gas supply pipe PL2 may be connected between the gas injection pipe GIP and the second source container module 230. One end of the second source gas supply pipe PL2 may be connected to an end of the gas injection pipe GIP through the first branch pipe BP1, and the other end of the second source gas supply pipe PL2 may be connected to the second source container module 230. In this case, the second source gas supply pipe PL2 may have a straight shape, but is not limited thereto. In other embodiments, the second source gas supply pipe PL2 may include at least one bending portion, based on a position of each of the gas injection pipe GIP and the second source container module 230.

The first source container module 210 may be connected to the first gas injection port 131 and may provide the first source gas having a first vapor pressure. That is, the first source container module 210 may be connected to the first gas injection port 131 through the first source gas supply pipe PL1 and the first branch pipe BP1 of the source gas plumbing line SGPL.

The first source container module 210 according to an embodiment may include a first source container 211, a first organic material (or a first organic material precursor) 213, and a first heating means (not shown).

The first source container 211 may vaporize the first organic material 213 into the first source gas and may supply the first source gas to the first source gas supply pipe PL1, based on a first carrier gas supplied from the first carrier gas supply module 220. The first source container 211 according to an embodiment may include a storage space which stores the first organic material 213, an input port which is supplied with the first carrier gas, and an output port which is connected to the first source gas supply pipe PL1.

The first organic material 213 may be an organic metal material having the first vapor pressure among materials of an oxide film which is used as a passivation layer, a transparent conductive layer, or a semiconductor layer provided on a substrate of a display apparatus, a solar cell, or a semiconductor light emitting device. The first organic material 213 according to an embodiment may be one material of diethylzinc (DEZn), triisobutylgallium (TIBGa), triethylgallium (TEGa), triethylindium (TEIn), trimethylindium (TMIn), and (3-dimethylaminopropyl)dimethylindium (DADI) each having the first vapor pressure of less than 200

Torr among a zinc-based material, a gallium-based material, and an indium-based material as shown in Table 1.

TABLE 1

| Chemical name | Acronym | Chemical formula | Vapor pressure |
|---|---|---|---|
| Diethylzinc | DEZn | $(C_2H_5)_2Zn$ | 18 Torr@300 K |
| Dimethylzinc | DMZn | $(CH_3)_2Zn$ | 400 Torr@300 K |
| Triisobutylgallium | TIBGa | $(C_4H_9)_3Ga$ | 0.1 Torr@300 K |
| Triethylgallium | TEGa | $(C_2H_5)_3Ga$ | 7.5 Torr@300 K |
| Trimethylgallium | TMGa | $(CH_3)_3Ga$ | 247 Torr@300 K |
| Triethylindium | TEIn | $(C_2H_5)_3In$ | 0.4 Torr@300 K |
| Trimethylindium | TMIn | $(CH_3)_3In$ | 3 Torr@300 K |
| (3-Dimethylaminopropyl) Dimethylindium | DADI | $(CH_3)_2In(CH_2)_3N(CH_3)_2$ | 1.5 Torr@300 K |

For example, in a case where a two-element oxide film including IZO(InZnO) or IGO(InGaO) is formed on the substrate S through a MOCVD process, the first organic material 213 may be one material of TEIn, TMIn, and DADI. As another example, in a case where a two-element oxide film including GZO(GaZnO) is formed on the substrate S through the MOCVD process, the first organic material 213 may be one material of DEZn, TIBGa, and TEGa.

The first heating means may heat the first source container 211 to vaporize the first organic material 213 stored in the first source container 211. The first heating means according to an embodiment may include a heating jacket surrounding the first source container 211.

The first carrier gas supply module 220 may supply the first carrier gas to the first source container module 210 so that the first source gas having the first vapor pressure which is relatively low is injected into the process chamber 100 at a high flow rate and a high pressure. That is, since the first source gas has the first vapor pressure of less than 200 Torr which is relatively low, a flow rate of the first source gas may not be controlled by using only a vapor pressure vaporized in the first source container 211. Therefore, the first carrier gas supply module 220 may inject the first carrier gas into the first source container 211 to control a pressure of the first source gas supply pipe PL1 and a flow rate of the first source gas including the first carrier gas supplied from the first source container 211 to the first source gas supply pipe PL1. The first carrier gas may be an inert gas (for example, argon (Ar) or nitrogen ($N_2$)).

The first carrier gas supply module 220 according to an embodiment may include a first carrier gas supply pipe 221 which is connected to the input port of the first source container 211, a first carrier gas supply source 223 which supplies the first carrier gas to the first carrier gas supply pipe 221, and a first flow rate control member 225 which is installed in the first carrier gas supply pipe 221.

The first flow rate control member 225 may control a flow rate and pressure of the first carrier gas supplied to the first source container 211 to control a pressure of the first source gas supply pipe PL1 and a flow rate of the first source gas which is vaporized in the first source container 211 and is supplied to the first source gas supply pipe PL1. Accordingly, a flow rate of the first source gas supplied to the first gas injection port 131 may be controlled by the first carrier gas.

The first flow rate control member 225 may control a flow rate "$FR_{source1}$" and a density "$D_{source1}$" of the first source gas, based on the following Equation (1). The first flow rate control member 225 according to an embodiment may control a flow rate "$FR_{carrier1}$" of the first carrier gas to control the flow rate "$FR_{source1}$" of the first source gas, thereby controlling the density "$D_{source1}$" of the first source gas, supplied from the first source container 211 to the first source gas supply pipe PL1, to 3% or less. To this end, the first flow rate control member 225 may control the flow rate "$FR_{carrier1}$" of the first carrier gas to hundreds to thousands standard cubic centimeters per minute (sccm), thereby controlling the flow rate "$FR_{source1}$" of the first source gas to several to tens sccm. However, the flow rate "$FR_{source1}$" and the density "$D_{source1}$" of the first source gas and the flow rate "$FR_{carrier1}$" of the first carrier gas may vary based on a composition ratio of the first organic material to an oxide film provided on the substrate S:

$$FR_{source1} = \frac{P_{source1}}{P_{container1}} \times FR_{carrier1} \qquad (1)$$

$$D_{source1} = \frac{FR_{source1}}{FR_{carrier1} + FO_{source1}} \times 100$$

In Equation (1), $P_{source1}$ may denote a vapor pressure of the first source gas, and $P_{container1}$ may denote an internal pressure of the first source container. As seen in Equation (1), the flow rate "$FR_{source1}$" and the density "$D_{source1}$" of the first source gas may be set based on the vapor pressure "$P_{source1}$" of the first source gas, the internal pressure "$P_{container1}$" of the first source container, and the flow rate "$FR_{carrier1}$" of the first carrier gas. However, the vapor pressure "$P_{source1}$" of the first source gas may correspond to a unique characteristic of the first organic material, and thus, it is unable to control a temperature in an actual process and it is difficult to maintain the internal pressure "$P_{container1}$" of the first source container as a normal pressure of 760 Torr or more without a separate apparatus. Accordingly, in the present embodiment, the flow rate "$FR_{source1}$" and the density "$D_{source1}$" of the first source gas having the first vapor pressure of 200 Torr or less which is relatively low may be finely controlled by controlling the flow rate "$FR_{carrier1}$" of the first carrier gas.

The second source container module 230 may be connected to the first gas injection port 131 and may provide the second source gas having a second vapor pressure which differs from the first vapor pressure. That is, the second source container module 230 may be connected to the first gas injection port 131 through the second source gas supply pipe PL2 and the first branch pipe BP1 of the source gas plumbing line SGPL.

The second source container module 230 according to an embodiment may include a second source container 231, a second organic material (or a second organic material precursor) 233, a second heating means (not shown), and a second flow rate control member 235.

The second source container 231 may vaporize the second organic material 233 into the second source gas and may supply the second source gas to the second source gas supply pipe PL2. The second source container 231 according to an embodiment may include a storage space which stores the second organic material 233 and an output port which is connected to the second source gas supply pipe PL2.

The second organic material 233 may be a liquid organic material, having the second vapor pressure which is relatively higher than the first vapor pressure of the first organic material 213, of the materials of the oxide film which is used as a passivation layer, a transparent conductive layer, or a semiconductor layer provided on a substrate of a display apparatus, a solar cell, or a semiconductor light emitting device. The second organic material 233 according to an embodiment may be trimethylgallium (TMGa) or dimethylzinc (DMZn) having the second vapor pressure of 200 Torr or more among a zinc-based material, a gallium-based material, and an indium-based material as shown in Table 1.

For example, in a case where a two-element oxide film including IZO(InZnO) is formed on the substrate S through an MOCVD process, the second organic material 233 may be DMZn, and the first organic material 213 may be DADI. Here, in the first organic material 213, DADI may be replaced with TEIn or TMIn.

As another example, in a case where a two-element oxide film including IGO(InGaO) is formed on the substrate S through the MOCVD process, the second organic material 233 may be TMGa, and the first organic material 213 may be DADI. Here, in the first organic material 213, DADI may be replaced with TEIn or TMIn.

As another example, in a case where a two-element oxide film including GZO(GaZnO) is formed on the substrate S through the MOCVD process, the second organic material 233 may be TMGa, and the first organic material 213 may be DEZn. Here, in the second organic material 233, TMGa may be replaced with DMZn. Also, in the first organic material 213, DEZn may be replaced with TIBGa or TEGa.

The second heating means may heat the second source container 231 to vaporize the second organic material 233 stored in the second source container 231. The second heating means according to an embodiment may include a heating jacket surrounding the second source container 231.

The second flow rate control member 235 may be installed between the output port of the second source container 231 and the second source gas supply pipe PL2.

The second flow rate control member 235 may control a flow rate of the second source gas supplied from the second source container 231 to the second source gas supply pipe PL2. That is, the second source gas may have a vapor pressure of 200 Torr or more, and thus, unlike the first source gas having a vapor pressure of less than 200 Torr which is relatively low, it is required to control a flow rate by using the second flow rate control member 235. The second flow rate control member 235 according to an embodiment may control a flow rate of the second source gas, supplied from the second source container 231 to the second source gas supply pipe PL2, to several to hundreds sccm, but without being limited thereto, the flow rate of the second source gas may vary based on a composition ratio of the second organic material to the oxide film provided on the substrate S.

The second flow rate control member 235 may be omitted, and the second source gas vaporized in the second source container 231 may be supplied to the second source gas supply pipe PL2 through a carrier gas manner identically to a supply manner corresponding to the first source gas, but in this case, due to a relatively high vapor pressure of the second organic material, a flow rate of the second source gas may have hundreds sccm which is several to hundreds times a flow rate of the first source gas under the same condition as the first source gas. Therefore, a density of the first source gas may be tens to hundreds times difference with a density of the second source gas. Due to a flow rate difference and a density difference between the first and second source gases, a composition of the oxide film provided on the substrate S may be non-uniform, and in order to uniformly provide the second source gas having a high density to the substrate S, the second source gas should be purged (or diluted) for a sufficient time. Therefore, in the present embodiment, instead of controlling a flow rate of the second source gas having the relatively high second vapor pressure by using a carrier gas, a flow rate of the second source gas may be controlled by using the second flow rate control member 235 installed between the output port of the second source container 231 and the second source gas supply pipe PL2.

The force gas supply module 240 may supply the force gas to a gas path between the second source container module 230 and the first gas injection port 131. That is, the force gas supply module 240 may supply the force gas to the second source gas supply pipe PL2 to control a flow rate and a pressure (or a plumbing pressure) of the second source gas supplied through the second source gas supply pipe PL2 to the first gas injection port 131. Also, the force gas supply module 240 may mix the force gas with the second source gas supplied from the second source container module 230 to the first gas injection port 131, thereby controlling a density of the second source gas supplied to the first gas injection port 131.

The force gas supply module 240 according to an embodiment may include a force gas supply pipe 241, a force gas supply source 243, and a third flow rate control member 245.

The force gas supply pipe 241 may be connected to the second source gas supply pipe PL2. In this case, the force gas supply pipe 241 may have a straight shape, but is not limited thereto. In other embodiments, the force gas supply pipe 241 may include at least one bending portion, based on a position of each of the second source gas supply pipe PL2 and the force gas supply source 243.

One end of the force gas supply pipe 241 may be connected to the second source gas supply pipe PL2, and the other end of the force gas supply pipe 241 may be connected to the force gas supply source 243.

The one end of the force gas supply pipe 241 according to an embodiment may be connected to the second source gas supply pipe PL2 at a portion which is relatively closer to the second flow rate control member 235 of the second source container module 230 than the gas injection pipe GIP. For example, a gas path length L between the second flow rate control member 235 and a connection portion CP between the second source gas supply pipe PL2 and the force gas supply pipe 241 may be set to 1 m or less, and a gas path length between the connection portion CP and the first branch pipe BP1 connected to the gas injection pipe GIP may be set to 1 m or more.

When the gas path length L between the second flow rate control member 235 and the connection portion CP is less than 1 m, a density of the second source gas supplied from the second source container module 230 to the second source gas supply pipe PL2 is be rapidly controlled, the second source gas may be more smoothly mixed with the force gas, and a pressure of each of the second source gas supply pipe PL2 and the gas injection pipe GIP connected between the connection portion CP and the first gas injection port 131 may increase.

On the other hand, when the gas path length L between the second flow rate control member 235 and the connection portion CP is 1 m or more, the gas path between the second flow rate control member 235 and the connection portion CP may relatively extend and a gas path between the connection portion CP and the first gas injection port 131 may relatively decrease. Accordingly, a flow rate and a pressure of the force gas should increase for increasing a pressure of each of the second source gas supply pipe PL2 and the gas injection pipe GIP connected between the connection portion CP and the first gas injection port 131, and due to this, it is difficult to rapidly control a density of the second source gas supplied to the second source gas supply pipe PL2.

The connection portion CP may include a second branch pipe BP2. Therefore, the one end of the force gas supply pipe 241 may be connected to the second source gas supply pipe PL2 through the second branch pipe BP2.

The force gas supply source 243 may supply the force gas to the force gas supply pipe 241. The force gas supply source 243 may store the force gas which includes an inert gas (for example, argon (Ar) or nitrogen ($N_2$)) or is the same as the first carrier gas and may supply the stored force gas to the force gas supply pipe 241 at a certain flow rate and a certain pressure.

The third flow rate control member 245 may be installed in the force gas supply pipe 241 and may control a pressure of the second source gas supply pipe PL2 and a flow rate of the force gas supplied from the force gas supply source 243 to the second source gas supply pipe PL2 (i.e., the second branch pipe BP2). Therefore, a flow rate and a density of the second source gas supplied to the first gas injection port 131 may be controlled by the force gas. Also, the third flow rate control member 245 may control a pressure of each of the second source gas supply pipe PL2 and the gas injection pipe GIP connected between the connection portion CP and the first gas injection port 131.

The third flow rate control member 245 may control a flow rate "$FR_{force}$" of the force gas mixed with the second source gas supplied to the second source gas supply pipe PL2, thereby control a density "$D_{source2}$" of the second source gas supplied through the second source gas supply pipe PL2 to the gas injection pipe GIP as in the following Equation (2). The third flow rate control member 245 according to an embodiment may control the flow rate "$FR_{force}$" of the force gas supplied to the second source gas supply pipe PL2 to thousands sccm, thereby controlling the density "$D_{source2}$" of the second source gas, supplied through the second flow rate control member 235 of the second source container module 230 to the second source gas supply pipe PL2, to 3% or less. Here, the density "$D_{source2}$" of the second source gas based on the flow rate "$FR_{force}$" of the force gas is not limited to 3% or less and may vary based on a composition ratio of the second organic material to the oxide film provided on the substrate S:

$$D_{source2} = \frac{FR_{source2}}{FR_{source2} + FR_{force}} \times 100 \quad (2)$$

The reactant gas supply module 250 may supply the reactant gas to the one or more second gas injection ports 133. The reactant gas supply module 250 may include one or more reactant gas supply pipes 251 which are respectively connected to the one or more second gas injection ports 133, a reactant gas supply source 253 which supplies the reactant gas to the one or more reactant gas supply pipes 251, and a fourth flow rate control member 255 which is installed in each of the one or more reactant gas supply pipes 251. Here, the reactant gas may include oxygen ($O_2$). The fourth flow rate control member 255 may control a flow rate and a pressure of the reactant gas supplied from the reactant gas supply source 253 to the one or more reactant gas supply pipes 251.

The purge gas supply module 260 may supply the purge gas to the first gas injection port 131. The purge gas supply module 260 according to an embodiment may include a purge gas supply pipe 261 which is connected to the gas injection pipe GIP, a purge gas supply source 263 which supplies the purge gas to the purge gas supply pipe 261, and a fifth flow rate control member 265 which is installed in the purge gas supply pipe 261. Here, the purge gas may include an inert gas (for example, argon (Ar) or nitrogen ($N_2$)) or may be the same as the first carrier gas or the force gas. The fifth flow rate control member 265 may control a flow rate and a pressure of the purge gas supplied from the purge gas supply source 263 to the purge gas supply pipe 261.

Additionally, the oxide film manufacturing apparatus according to an embodiment of the present disclosure may further include a bypass exhaust module 400.

The bypass exhaust module 400 may selectively exhaust the first source gas, the second source gas, the reactant gas, and the purge gas each supplied to the gas injection pipe GIP according to a predetermined process cycle. The bypass exhaust module 400 according to an embodiment may include a bypass exhaust pipe 410, an exhaust means 430, and first to fourth valves V1 to V4.

The bypass exhaust pipe 410 may be connected to the first source gas supply pipe PL1, the second source gas supply pipe PL2, the reactant gas supply pipe 251, and the purge gas supply pipe 261 which are adjacent to the gas injection pipe GIP.

The exhaust means 430 may be connected to an outlet side of the bypass exhaust pipe 410 and may exhaust a gas supplied through the bypass exhaust pipe 410. The exhaust means 430 according to an embodiment may include an exhaust pump.

The first valve V1 may be installed in the first source gas supply pipe PL1 adjacent to the first branch pipe BP1 and may communicate the first source gas supply pipe PL1 with the gas injection pipe GIP or the bypass exhaust pipe 410. The first valve V1 according to an embodiment may communicate the first source gas supply pipe PL1 with the gas injection pipe GIP during only a source gas injecting process included in a deposition process cycle corresponding to the oxide film.

The second valve V2 may be installed in the second source gas supply pipe PL2 adjacent to the first branch pipe BP1 and may communicate the second source gas supply pipe PL2 with the gas injection pipe GIP or the bypass exhaust pipe 410. The second valve V2 according to an embodiment may communicate the second source gas supply pipe PL2 with the gas injection pipe GIP during only the source gas injecting process included in the deposition process cycle corresponding to the oxide film.

The third valve V3 may be installed in the reactant gas supply pipe 251 adjacent to the one or more second gas injection ports 133 and may communicate the reactant gas supply pipe 251 with the one or more second gas injection ports 133 or the bypass exhaust pipe 410. The third valve V3 according to an embodiment may communicate the reactant gas supply pipe 251 with the one or more second gas injection ports 133 during only a reactant gas injecting process included in the deposition process cycle corresponding to the oxide film.

The fourth valve V4 may be installed in the purge gas supply pipe 261 adjacent to the gas injection pipe GIP and may communicate the purge gas supply pipe 261 with the gas injection pipe GIP or the bypass exhaust pipe 410. The fourth valve V4 according to an embodiment may communicate the purge gas supply pipe 261 with the gas injection pipe GIP during only a purge gas injecting process included in the deposition process cycle corresponding to the oxide film.

The oxide film manufacturing apparatus according to an embodiment of the present disclosure may indirectly control a flow rate and a density of the first source gas having the relatively low first vapor pressure among source gases having different vapor pressures by using a carrier gas and may directly control a density of the second source gas having the relatively high second vapor pressure by using the third flow rate control member 245 and the force gas, and thus, may increase a pressure of a pipe through which the mixed source gas flows, based on the force gas, thereby distributing the mixed source gas to the substrate S at a low density and a high pressure for a relatively short time (for example, less than one second). Accordingly, the composition non-uniformity of the oxide film caused by a density of the second source gas having the relatively high second vapor pressure may be minimized, and a deposition speed may increase to 20 Å/min or more, thereby providing an oxide film having thickness uniformity of 5% or less.

The oxide film manufacturing apparatus according to an embodiment of the present disclosure may form a three-element oxide film, including IGZO(InGaZnO), GZTO (GaZnSnO), or ITZO(InSnZnO) capable of being used as an oxide semiconductor layer or a transparent conductive layer, on the substrate S by using an MOCVD process. In this case, the oxide film manufacturing apparatus according to an embodiment of the present disclosure may further include a third source container module 270 and a second carrier gas supply module 280.

First, the source gas plumbing line SGPL may further include a third source gas supply pipe PL3 connected between the third source container module 270 and the gas injection pipe GIP.

One end of the third source gas supply pipe PL3 may be connected to an end of the gas injection pipe GIP through the first branch pipe BP1, and the other end of the third source gas supply pipe PL3 may be connected to the third source container module 270.

The third source container module 270 may be connected to the first gas injection port 131 and may provide the third source gas having a third vapor pressure which differs from the second vapor pressure of the second source gas. That is, the third source container module 270 may be connected to the first gas injection port 131 through the third source gas supply pipe PL3 and the first branch pipe BP1 of the source gas plumbing line SGPL.

The third source container module 270 according to an embodiment may include a third source container 271, a third organic material (or a third organic material precursor) 273, and a third heating means.

The third source container 271 may vaporize a third organic material 273 into a third source gas and may supply the third source gas to the third source gas supply pipe PL3, based on a second carrier gas supplied from the second carrier gas supply module 280. The third source container 271 according to an embodiment may include a storage space which stores the third organic material 273, an input port which is supplied with the second carrier gas, and an output port which is connected to the third source gas supply pipe PL3.

The third organic material 273 may be an organic metal material having the third vapor pressure among materials of an oxide film which is used as a passivation layer, a transparent conductive layer, or a semiconductor layer provided on a substrate of a display apparatus, a solar cell, or a semiconductor light emitting device. The third organic material 273 according to an embodiment may be an indium-based material such as DADI, TEIn, or TMIn in Table 1, or may be a tin-based material such as tetraethyltin (TESn) or tetramethyltin (TMSn) having the third vapor pressure of less than 200 Torr as in the following Table 2.

TABLE 2

| Chemical name | Acronym | Chemical formula | Vapor pressure |
|---|---|---|---|
| Tetraethyltin | TESn | $(C_2H_5)_4Sn$ | 0.6 Torr@300 K |
| Tetramethyltin | TMSn | $(CH_3)_3Sn$ | 111 Torr@300 K |

Referring to Tables 1 and 2, in a case where a three-element oxide film including IGZO(InGaZnO) is formed on the substrate S through an MOCVD process, the first organic material 213 may be DEZn, the second organic material 233 may be TMGa, and the third organic material 273 may be DADI. Here, in the first organic material 213, DEZn may be replaced with TIBGa or TEGa. Also, in the second organic material 233, TMGa may be replaced with DMZn. Also, in the third organic material 273, DADI may be replaced with TEIn or TMIn.

As another example, in a case where a three-element oxide film including GZTO(GaZnSnO) is formed on the substrate S through the MOCVD process, the first organic material 213 may be DEZn, the second organic material 233 may be TMGa, and the third organic material 273 may be TESn. Here, in the first organic material 213, DEZn may be replaced with TIBGa or TEGa. Also, in the second organic material 233, TMGa may be replaced with DMZn. Also, in the third organic material 273, TESn may be replaced with TMSn.

As another example, in a case where a three-element oxide film including ITZO(InSnZnO) is formed on the substrate S through the MOCVD process, the first organic material 213 may be DADI, the second organic material 233 may be DMZn, and the third organic material 273 may be TESn. Here, in the first organic material 213, DADI may be replaced with TEIn or TMIn. Also, in the third organic material 273, TESn may be replaced with TMSn.

The third heating means may heat the third source container 271 to vaporize the third organic material 273 stored in the third source container 271. The third heating means according to an embodiment may include a heating jacket surrounding the third source container 271.

The second carrier gas supply module 280 may supply the second carrier gas to the third source container module 270 so that the third source gas having the third vapor pressure which is relatively lower than the second vapor pressure of the second source gas is injected into the process chamber 100 at a high flow rate and a high pressure. That is, since the third source gas has the third vapor pressure of less than 200 Torr which is relatively low, a flow rate of the third source gas may not be controlled by using only a vapor pressure vaporized in the third source container 271. Therefore, the second carrier gas supply module 280 may inject the second carrier gas into the third source container 271 to control a pressure of the third source gas supply pipe PL3 and a flow rate of the third source gas including the second carrier gas supplied from the third source container 271 to the third source gas supply pipe PL3. The second carrier gas may include an inert gas (for example, argon (Ar) or nitrogen (N$_2$)), or may be the same as the first carrier gas.

The second carrier gas supply module 280 according to an embodiment may include a second carrier gas supply pipe 281 which is connected to the input port of the third source container 271, a second carrier gas supply source 283 which supplies the second carrier gas to the second carrier gas supply pipe 281, and a sixth flow rate control member 285 which is installed in the second carrier gas supply pipe 281.

The sixth flow rate control member 285 may control a flow rate and pressure of the second carrier gas supplied to the third source container 271 to control a pressure of the third source gas supply pipe PL3 and a flow rate of the third source gas supplied from the third source container 271 to the third source gas supply pipe PL3. Accordingly, a flow rate of the third source gas supplied to the first gas injection port 131 may be controlled by the second carrier gas.

The sixth flow rate control member 285 may control a flow rate "$FR_{source3}$" and a density "$D_{source3}$" of the third source gas, based on the following Equation (3). The sixth flow rate control member 285 according to an embodiment may control a flow rate "$FR_{carrier2}$" of the second carrier gas to control the flow rate "$FR_{source3}$" of the third source gas, thereby controlling the density "$D_{source3}$" of the third source gas, supplied from the third source container 271 to the third source gas supply pipe PL3, to 3% or less. To this end, the sixth flow rate control member 285 may control the flow rate "$FR_{carrier2}$" of the second carrier gas to hundreds to thousands sccm, thereby controlling the flow rate "$FR_{source3}$" of the third source gas to several to tens sccm. However, the flow rate "$FR_{source3}$" and the density "$D_{source3}$" of the third source gas and the flow rate "$FR_{carrier2}$" of the second carrier gas may vary based on a composition ratio of the third organic material to the oxide film provided on the substrate S:

$$FR_{source3} = \frac{P_{source3}}{P_{container3}} \times FR_{carrier2} \quad (3)$$

$$D_{source3} = \frac{FR_{source3}}{FR_{carrier2} + FR_{source3}} \times 100$$

In Equation (3), $P_{source3}$ may denote a vapor pressure of the third source gas, and $P_{container3}$ may denote an internal pressure of the third source container. As seen in Equation (3), the flow rate "$FR_{source3}$" and the density "$D_{source3}$" of the third source gas may be set based on the vapor pressure "$P_{source3}$" of the third source gas, the internal pressure "$P_{container3}$" of the third source container, and the flow rate "$FR_{carrier2}$" of the second carrier gas. However, the vapor pressure "$P_{source3}$" of the third source gas may correspond to a unique characteristic of the third organic material, and thus, it is unable to control a temperature in an actual process and it is difficult to maintain the internal pressure "$P_{container3}$" of the third source container as a normal pressure of 760 Torr or more without a separate apparatus. Accordingly, in the present embodiment, the flow rate "$FR_{source3}$" and the density "$D_{source3}$" of the third source gas having the third vapor pressure of less than 200 Torr which is relatively low may be finely controlled by controlling the flow rate "$FR_{carrier2}$" the second carrier gas.

The bypass exhaust module 400 of the oxide film manufacturing apparatus according to an embodiment of the present disclosure may further include a fifth valve V5.

First, the bypass exhaust pipe 410 of the bypass exhaust module 400 may be additionally connected to the third source gas supply pipe PL3 adjacent to the gas injection pipe GIP.

The fifth valve V5 may be installed in the third source gas supply pipe PL3 adjacent to the first branch pipe BP1 and may communicate the third source gas supply pipe PL3 with the gas injection pipe GIP or the bypass exhaust pipe 410. The fifth valve V5 according to an embodiment may communicate the third source gas supply pipe PL3 with the gas injection pipe GIP during only the source gas injecting process included in the deposition process cycle corresponding to the oxide film.

The oxide film manufacturing apparatus according to an embodiment of the present disclosure may form a four-element oxide film, including IGZTO(InGaZnSnO) capable of being used as an oxide semiconductor layer or a transparent conductive layer, on the substrate S by using an MOCVD process. In this case, the oxide film manufacturing apparatus according to an embodiment of the present disclosure may further include a fourth source container module 290 and a third carrier gas supply module 300.

First, the source gas plumbing line SGPL may further include a fourth source gas supply pipe PL4 connected between the fourth source container module 290 and the gas injection pipe GIP. One end of the fourth source gas supply pipe PL4 may be connected to an end of the gas injection pipe GIP through the first branch pipe BP1, and the other end of the fourth source gas supply pipe PL4 may be connected to the fourth source container module 290.

The fourth source container module 290 may be connected to the first gas injection port 131 and may provide a fourth third source gas having a fourth vapor pressure which differs from the second vapor pressure of the second source gas. That is, the fourth source container module 290 may be connected to the first gas injection port 131 through the fourth source gas supply pipe PL4 and the first branch pipe BP1 of the source gas plumbing line SGPL.

The fourth source container module 290 according to an embodiment may include a fourth source container 291, a fourth organic material (or a fourth organic material precursor) 293, and a fourth heating means. Except for that the fourth source gas vaporized from a fourth organic material 293 by the fourth heating means is supplied to the fourth source gas supply pipe PL4 of the source gas plumbing line SGPL, the fourth source container module 290 having such a configuration is the same as the first source container module 210 or the third source container module 270, and thus, its repetitive description is omitted.

The fourth organic material 293 may be an organic metal material having the fourth vapor pressure among materials of an oxide film which is used as a passivation layer, a transparent conductive layer, or a semiconductor layer provided on a substrate of a display apparatus, a solar cell, or a semiconductor light emitting device. The fourth organic material 293 according to an embodiment may be one material other than the first organic material 211 and the third organic material 271 among a zinc-based material, a gallium-based material, and an indium-based material in Tables 1 and 2.

For example, in a case where a four-element oxide film including IGZTO(InGaZnSnO) is formed on the substrate S through an MOCVD process, the first organic material 213 may be DEZn, the second organic material 233 may be TMGa, and the third organic material 273 may be DADI, and the fourth organic material 293 may be TESn. Here, in the first organic material 213, DEZn may be replaced with TIBGa or TEGa. Also, in the second organic material 233, TMGa may be replaced with DMZn. Also, in the third organic material 273, DADI may be replaced with TEIn or TMIn. Also, in the fourth organic material 293, TESn may be replaced with TMSn.

The third carrier gas supply module 300 may supply the third carrier gas to the fourth source container module 290 so that the fourth source gas having the fourth vapor pressure which is relatively lower than the second vapor pressure of the second source gas is injected into the process chamber 100 at a high flow rate and a high pressure, identically to the first carrier gas supply module 220 or the second carrier gas supply module 280. That is, the third carrier gas supply module 300 may inject the third carrier gas into the fourth source container 291 to control a pressure of the fourth source gas supply pipe PL4 and a flow rate of the fourth source gas including the third carrier gas supplied from the fourth source container 291 to the fourth source gas supply pipe PL4. The third carrier gas may include an inert gas (for example, argon (Ar) or nitrogen ($N_2$)), or may be the same as the first carrier gas.

The third carrier gas supply module 300 according to an embodiment may include a third carrier gas supply pipe 301 which is connected to an input port of the fourth source container 291, a third carrier gas supply source 303 which supplies the third carrier gas to the third carrier gas supply pipe 301, and a seventh flow rate control member 305 which is installed in the third carrier gas supply pipe 301.

The seventh flow rate control member 305 may control a flow rate and pressure of the third carrier gas supplied to the fourth source container 291 to control a pressure of the fourth source gas supply pipe PL4 and a flow rate of the fourth source gas supplied from the fourth source container 291 to the fourth source gas supply pipe PL4. Accordingly, a flow rate of the fourth source gas supplied to the first gas injection port 131 may be controlled by the third carrier gas.

The seventh flow rate control member 305 may control a flow rate and a density "of the fourth source gas similarly to Equation (3). The seventh flow rate control member 305 according to an embodiment may control a flow rate of the third carrier gas to control the flow rate of the fourth source gas, thereby controlling the density "of the fourth source gas, supplied from the fourth source container 291 to the fourth source gas supply pipe PL4, to 3% or less. To this end, the seventh flow rate control member 305 may control the flow rate of the third carrier gas to hundreds to thousands sccm, thereby controlling the flow rate of the fourth source gas to several to tens sccm. However, the flow rate and the density of the fourth source gas and the flow rate of the third carrier gas may vary based on a composition ratio of the fourth organic material to the oxide film provided on the substrate S.

The bypass exhaust module 400 of the oxide film manufacturing apparatus according to an embodiment of the present disclosure may further include a sixth valve V6.

First, the bypass exhaust pipe 410 of the bypass exhaust module 400 may be additionally connected to the fourth source gas supply pipe PL4 adjacent to the gas injection pipe GIP.

The sixth valve V6 may be installed in the fourth source gas supply pipe PL4 adjacent to the first branch pipe BP1 and may communicate the fourth source gas supply pipe PL4 with the gas injection pipe GIP or the bypass exhaust pipe 410. The sixth valve V6 according to an embodiment may communicate the fourth source gas supply pipe PL4 with the gas injection pipe GIP during only the source gas injecting process included in the deposition process cycle corresponding to the oxide film.

Figure 3:
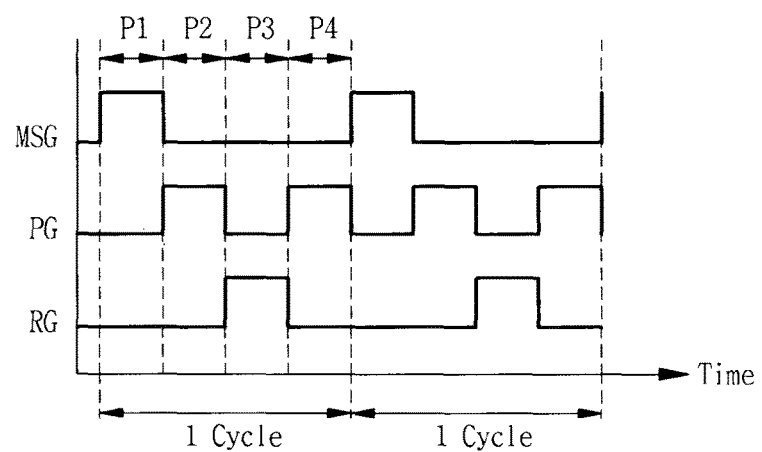
FIG. 3 is a diagram illustrating a method of manufacturing an oxide film according to an embodiment of the present disclosure.
Figure 4:
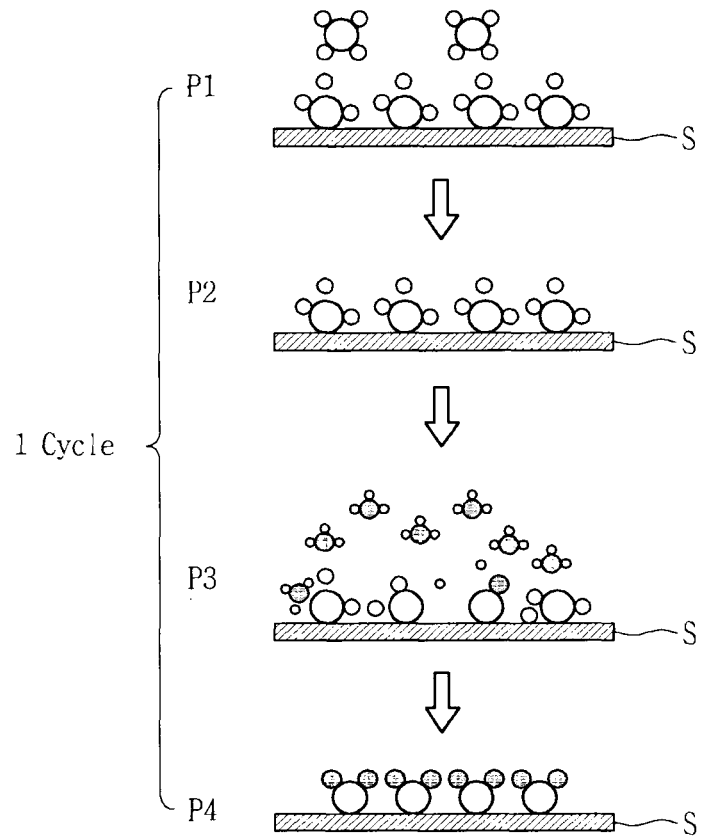
FIG. 4 is a diagram illustrating a film forming mechanism of an oxide film based on a method of manufacturing an oxide film according to an embodiment of the present disclosure.

FIG. 3 is a diagram illustrating a method of manufacturing an oxide film according to an embodiment of the present disclosure, and FIG. 4 is a diagram illustrating a film forming mechanism of an oxide film based on a method of manufacturing an oxide film according to an embodiment of the present disclosure. FIGS. 3 and 4 are diagrams for describing an oxide film manufacturing method using the oxide film manufacturing apparatus according to an embodiment of the present disclosure illustrated in FIGS. 1 and 2.

Referring to FIGS. 3 and 4 in conjunction with FIGS. 1 and 2, the method of manufacturing the oxide film according to an embodiment of the present disclosure may include: generating the first source gas having the first vapor pressure by using the first source container module 210 connected to the first gas injection port 131 of the process chamber 100; generating the second source gas having the second vapor pressure differing from the first vapor pressure by using the second source container module 230 connected to the first gas injection port 131; supplying the first carrier gas to the first source container module 210 to supply the first source gas to the first gas injection port 131; supplying the force gas to a gas path between the second source container module 230 and the first gas injection port 131 to supply the second source gas to the first gas injection port 131; supplying the reactant gas to the one or more second gas injection ports 133 of the process chamber 100; supplying the purge gas to the first gas injection port 131; and distributing the first and second source gases, the reactant gas, and the purge gas to the substrate S.

Moreover, the method of manufacturing the oxide film according to an embodiment of the present disclosure may further include: generating the third source gas having the third vapor pressure differing from the second vapor pressure by using the third source container module 270 connected to the first gas injection port 131; and supplying the second carrier gas to the third source container module 270 to supply the third source gas to the first gas injection port 131.

Moreover, the method of manufacturing the oxide film according to an embodiment of the present disclosure may further include: generating the fourth source gas having the fourth vapor pressure differing from the second vapor pressure by using the fourth source container module 290 connected to the first gas injection port 131; and supplying the third carrier gas to the fourth source container module 290 to supply the fourth source gas to the first gas injection port 131.

The method of manufacturing the oxide film according to an embodiment of the present disclosure may sequentially perform a source gas injecting process (P1), a source gas purging process (P2), a reactant gas injecting process (P3), and a reactant gas purging process (P4) to form an oxide film on the substrate S. For example, the oxide film may be a two-element oxide film including IZO(InZnO), IGO(In-GaO), or GZO(GaZnO). As another example, the oxide film may be a three-element oxide film including IGZO(InGaZnO), GZTO(GaZnSnO), or ITZO(InSnZnO). As another example, the oxide film may be a four-element oxide film including IGZTO(InGanSnO).

Hereinafter, the method of manufacturing the oxide film according to an embodiment of the present disclosure will be described.

First, a low pressure atmosphere may be provided in the reaction space of the process chamber 100.

Subsequently, the source gas injecting process (P1) of distributing a mixed source gas MSG to the substrate S to adsorb an organic material precursor mixed into the mixed source gas MSG onto the substrate S may be performed for one second or less (for example, 0.3 seconds to 0.7 seconds). In more detail, during the source gas injecting process (P1), by supplying the mixed source gas MSG to the gas distribution module 140 of the process chamber 100 through the gas injection pipe GIP, the mixed source gas MSG having a low density may be distributed to the substrate S at a relatively high pressure through the plurality of first shower holes SH1 provided in the gas distribution module 140 within a short time. The mixed source gas MSG according to an embodiment may be a mixed gas of the first source gas including the first carrier gas and the second source gas including the force gas. According to another embodiment, the mixed source gas MSG may be a mixed gas of the first source gas including the first carrier gas, the second source gas including the force gas, and the third source gas including the second carrier gas. According to another embodiment, the mixed source gas MSG may be a mixed gas of the first source gas including the first carrier gas, the second source gas including the force gas, the third source gas including the second carrier gas, and the fourth source gas including the third carrier gas. The mixed source gas MSG may be uniformly mixed in the gas injection pipe GIP, based on a flow rate and a pressure of the force gas, and may be supplied to the gas distribution module 140 at a high pressure through the first gas injection port 131 of the process chamber 100.

Subsequently, the source gas purging process (P2) of blocking the mixed source gas MSG supplied to the gas distribution module 140 of the process chamber 100 and distributing a purge gas PG to the substrate S to purge (or remove) an organic material precursor remaining in the reaction space of the process chamber 100 without being adsorbed onto the substrate S may be performed for one second or less (for example, 0.3 seconds to 0.7 seconds). In more detail, during the source gas purging process (P2), by supplying the purge gas PG to the gas distribution module 140 of the process chamber 100 through the gas injection pipe GIP, the purge gas PG may be distributed to the substrate S through the plurality of first shower holes SH1 provided in the gas distribution module 140, thereby purging the mixed source gas MSG and the organic material precursor remaining in the reaction space of the process chamber 100 and simultaneously inducing the organic material precursor to be uniformly adsorbed onto the substrate S.

Subsequently, the reactant gas injecting process (P3) of blocking the purge gas PG supplied to the gas distribution module 140 of the process chamber 100, distributing a reactant gas RG to the substrate S, and generating plasma to react the reactant gas RG with the organic material precursor adsorbed onto the substrate S may be performed for one second or less (for example, 0.3 seconds to 0.7 seconds). In more detail, during the reactant gas injecting process (P3), by supplying the reactant gas RG to the gas distribution module 140 through the second gas injection port 133 of the process chamber 100, the reactant gas RG may be distributed to the substrate S through the plurality of second shower holes SH2 provided in the gas distribution module 140, and simultaneously, a plasma power may be applied to the conductive plate 143 of the gas distribution module 140, thereby generating the plasma around a gas distribution surface of the gas distribution module 140. Accordingly, the reactant gas RG distributed to the substrate S through the plurality of second shower holes SH2 may be activated by the plasma, and the activated reactant gas may react with the organic material precursor adsorbed onto the substrate S, whereby a two-element or three-element oxide film may be formed on the substrate S.

Subsequently, the reactant gas purging process (P4) of blocking the reactant gas RG supplied to the gas distribution module 140 of the process chamber 100 and simultaneously distributing the purge gas PG to the substrate S to purge (or remove) a non-reactant gas remaining in the reaction space of the process chamber 100 may be performed for one second or less (for example, 0.3 seconds to 0.7 seconds). In more detail, during the reactant gas purging process (P4), by supplying the purge gas PG to the gas distribution module 140 of the process chamber 100 through the gas injection pipe GIP, the purge gas PG may be distributed to the substrate S through the plurality of first shower holes SH1 provided in the gas distribution module 140, thereby purging the non-reactant gas remaining in the reaction space of the process chamber 100.

The method of manufacturing the oxide film by using the oxide film manufacturing apparatus according to an embodiment of the present disclosure may indirectly control a flow rate and a density of a source gas having a relatively low vapor pressure by using a carrier gas and may directly control a density of a source gas having a relatively high vapor pressure by using the third flow rate control member 245 and the force gas, and thus, may increase a pressure of a pipe through which the mixed source gas flows, based on the force gas, thereby distributing the mixed source gas to the substrate S at a low density and a high pressure for a relatively short time (for example, less than one second). Accordingly, the composition non-uniformity of the oxide film caused by a flow rate and a density of the source gas having a relatively high vapor pressure may be minimized, and an oxide film which is high in density and purity may be formed at a deposition speed of 20 Å/min or more, thereby providing an oxide film having thickness uniformity of 5% or less.

Figure 5:
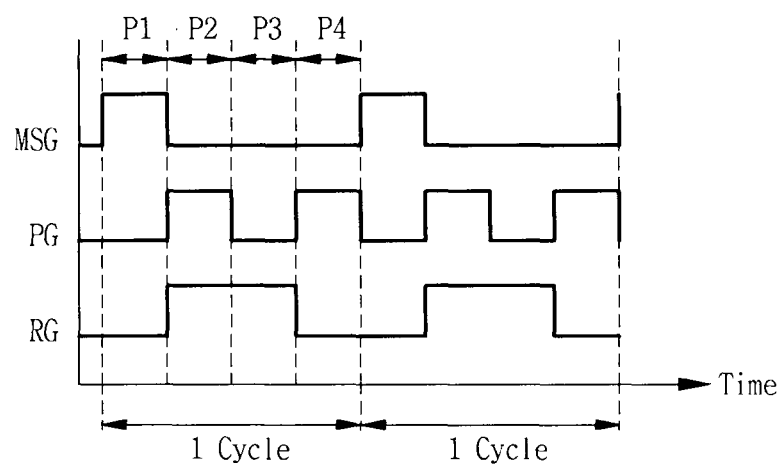
FIG. 5 is a diagram for describing a method of manufacturing an oxide film according to another embodiment of the present disclosure.

Optionally, in the method of manufacturing the oxide film according to an embodiment of the present disclosure, as illustrated in FIG. 5, the reactant gas RG may be supplied during the source gas purging process (P2) and the reactant gas injecting process (P3). In this case, the method of manufacturing the oxide film according to an embodiment of the present disclosure may shorten a time for which an oxygen atmosphere for generating oxygen plasma is formed in the reaction space in the reactant gas injecting process (P3), thereby more increasing a deposition speed.

Figure 6:
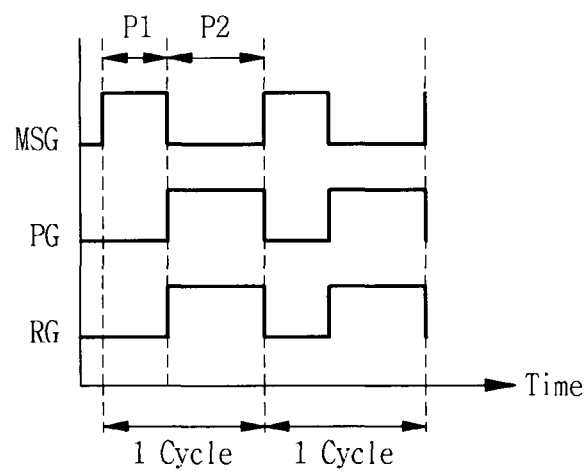
FIG. 6 is a diagram for describing a method of manufacturing an oxide film according to another embodiment of the present disclosure.
Figure 7:
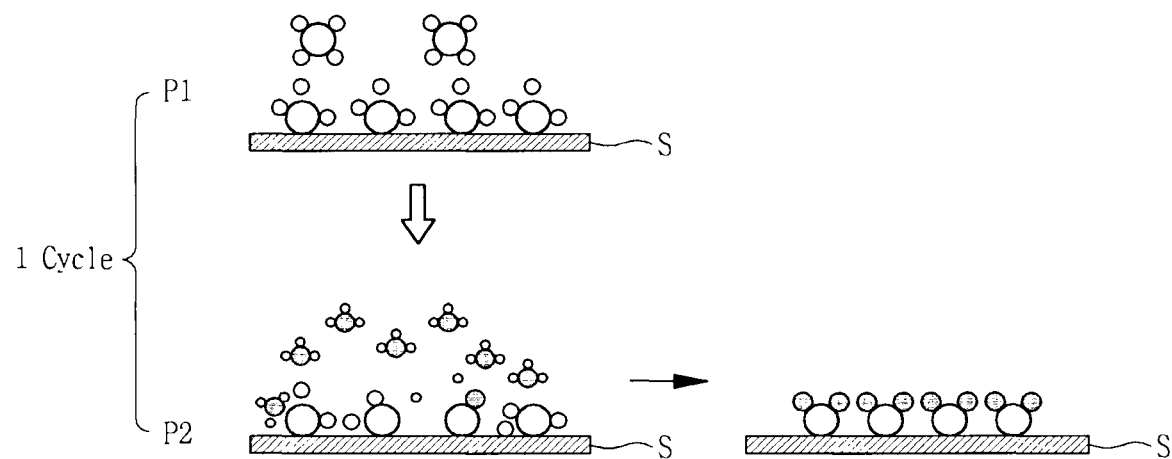
FIG. 7 is a diagram illustrating a film forming mechanism of an oxide film based on a method of manufacturing an oxide film according to another embodiment of the present disclosure.

Moreover, in the method of manufacturing the oxide film according to an embodiment of the present disclosure, as illustrated in FIGS. 6 and 7, one integration process (P2) including the source gas purging process, the reactant gas injecting process, and the reaction gas purging process each performed after the source gas injecting process (P1) may be performed. In this case, in the method of manufacturing the oxide film according to an embodiment of the present disclosure, an oxide film may be formed on a substrate by using only the source gas injecting process (P1) and the integration process (P2), and thus, a process time may be considerably shortened, thereby more increasing a deposition speed. The method of manufacturing the oxide film according to an embodiment of the present disclosure may be applied to a process of forming an oxide film used as a transparent conductive layer rather than a process of forming an oxide film used as an oxide semiconductor layer requiring a high density and a high purity.

Figure 8:
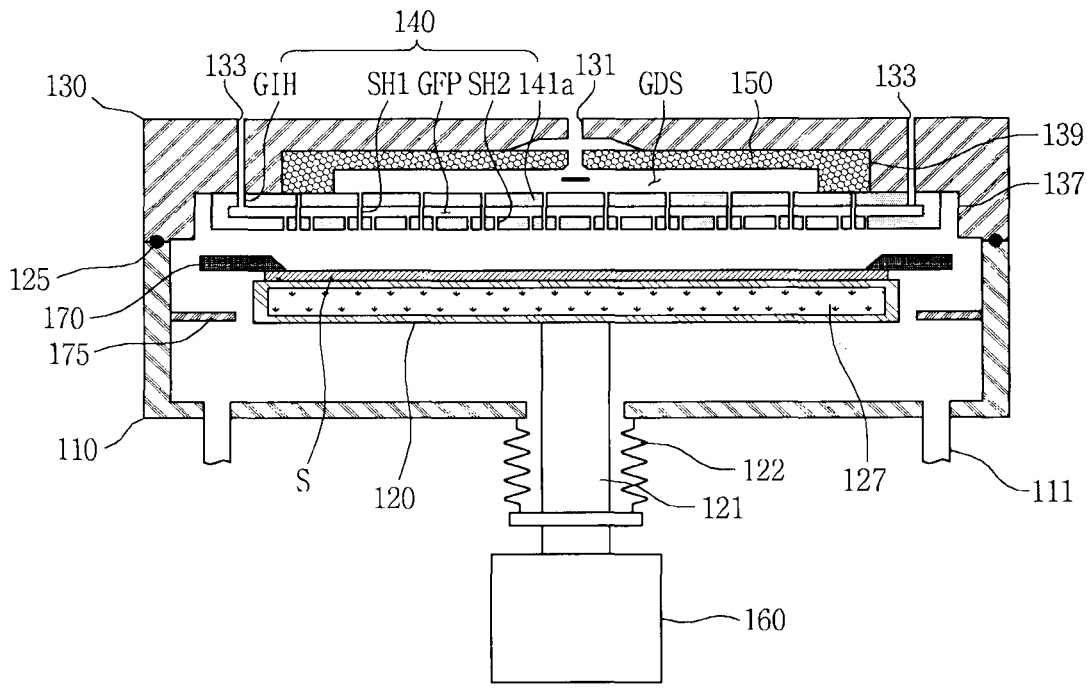
FIG. 8 is a diagram illustrating a process chamber according to another embodiment in an apparatus for manufacturing an oxide film according to an embodiment of the present disclosure.

FIG. 8 is a diagram illustrating a process chamber according to another embodiment in an apparatus for manufacturing an oxide film according to an embodiment of the present disclosure and illustrates an example where a structure of each of a gas distribution module and a susceptor is modified in the process chamber illustrated in FIGS. 1 and 2. Hereinafter, therefore, only a gas distribution module and a susceptor will be described, and repetitive descriptions of the other elements are omitted.

Referring to FIG. 8 in conjunction with FIG. 1, in the process chamber according to another embodiment, a susceptor 120 may be installed in a reaction space of a lower chamber 110, and the susceptor 120 may support a substrate S and may heat the supported substrate S at a process temperature. The susceptor 120 according to an embodiment may include a substrate heating apparatus 127.

The substrate heating apparatus 127 may include a heater which is embedded into the susceptor 120 to heat the substrate S.

The heater may heat the substrate S by using a heating wire heating manner using a heating wire, an induction heating manner using an inductive current generated by a coil, or a lamp heating manner using a lamp heater including a heat generating filament.

In the process chamber according to another embodiment, a gas distribution module 140 may include a shower body 141a, a plurality of first shower holes SH1, a plurality of gas flow paths GFP, one or more reactant gas injection holes GIH, and a plurality of second shower holes SH2. The gas distribution module 140 according to the present embodiment may have a structure where the plurality of protrusions 141b, the conductive plate 143, and the insulation plate 145 for generating plasma in gas distribution module 140 illustrated in FIG. 2 are omitted.

The shower body 141a may be installed in or fixed to an edge portion of a second concave portion 137 to cover a third concave portion 139 provided on a rear surface of a chamber lid 130. The shower body 141a may include a conductive material and may be electrically grounded through the chamber lid 130.

Each of the plurality of first shower holes SH1 may distribute a mixed source gas, supplied via a first gas injection port 131 and a gas diffusion space GDS, to the substrate S. The plurality of first shower holes SH1 according to an embodiment may be arranged at certain intervals and may be provided to vertically pass through the shower body 141a in a thickness direction Z of the shower body 141a.

The plurality of gas flow paths GFP may be provided inside the shower body 141a to long extend in a first direction X and may be arranged at certain intervals in a second direction Y intersecting the first direction X. In this case, each of the plurality of first shower holes SH1 may be disposed between two adjacent gas flow paths of the plurality of gas flow paths GFP so as not to be connected to each of the plurality of gas flow paths GFP.

The one or more reactant gas injection holes GIH may be provided inside the shower body 141a to overlap the one or more second gas injection ports 133 and intersect one side and/or the other side of each of the plurality of gas flow paths GFP. The one or more reactant gas injection holes GIH may be connected to each of the plurality of gas flow paths GFP and the one or more second gas injection ports 133, and thus, may supply the reactant gas, supplied via the one or more second gas injection ports 133, to each of the plurality of gas flow paths GFP.

Each of the plurality of second shower holes SH2 may be provided adjacent to a corresponding first shower hole of the plurality of first shower holes SH1 and may distribute a reactant gas, supplied through a corresponding gas flow path of the plurality of gas flow paths GFP, to the substrate S. Here, the reactant gas may be ozone ($O_3$), water vapor ($H_2O$), or the like.

Each of the plurality of second shower holes SH2 according to an embodiment may be provided vertical to the shower body 141a in the thickness direction Z of the shower body 141a so as to be connected to a corresponding gas flow path, which is adjacent to a corresponding first shower hole of the plurality of first shower holes SH1, of the plurality of gas flow paths GFP. For example, at least four second shower holes SH2 may be disposed near each of the plurality of first shower holes SH1.

Except for that a thermal reaction process is performed by using the heating of a substrate by the substrate heating apparatus 127 instead of a plasma reaction, a method of manufacturing an oxide film by using an oxide film manufacturing apparatus including the process chamber according to another embodiment of the present disclosure is the same as the manufacturing method illustrated in FIGS. 3 to 7, and thus, its repetitive description is omitted.

The method of manufacturing the oxide film by using the oxide film manufacturing apparatus including the process chamber according to another embodiment of the present disclosure may provide the same effect as the method of manufacturing the oxide film by using the oxide film manufacturing apparatus according to an embodiment of the present disclosure.

Hereinafter, an embodiment of the present disclosure, a comparative example 1, and a comparative example 2 will be described.

First, in an experiment performed on an embodiment of the present disclosure, a three-element oxide film including IGZO(InGaZnO) may have been formed on a substrate by supplying an indium source gas, a zinc source gas, and a gallium source gas to a process chamber under a condition shown in the following Table 3.

TABLE 3

| Division | In(DADI) | Zn(DEZ) | Ga(TMGa) |
| --- | --- | --- | --- |
| Flow rate of carrier gas (1) | 1000 sccm | 500 sccm | 0 sccm |
| Vapor pressure of source gas (2) | 1.5 Torr | 15 Torr | 300 Torr |
| Pressure of container (3) | 100 Torr | 500 Torr | 300 Torr |
| Flow rate of source gas (4) | 15 sccm | 15 sccm | 15 sccm |
| Flow rate of force gas (5) | 0 | 0 | 1000 sccm |
| Density of source gas [(4)/{(1) + (4) + (5)}] | 1.5% | 2.9% | 1.5% |

As seen in Table 3, based on Equations (1) to (3), by controlling a flow rate of the carrier gas and a flow rate of the force gas, flow rates of the indium source gas, the zinc source gas, and the gallium source gas having different vapor pressures may have been identically controlled to 15 sccm, a density of the indium source gas and a density of the gallium source gas may each have been controlled to 1.5%, and a density of the zinc source gas may have been controlled to 2.9%. Generally, a density of a source gas may be reduced for adsorbing an oxide film onto a large-size substrate and purging the oxide film. Therefore, in an embodiment of the present disclosure, a three-element source gas having different vapor pressures may have been supplied to a process chamber at a relatively high pressure by controlling a density thereof to a low density of 3% or less, thereby improving the composition uniformity of an oxide film deposited on the substrate and increasing a deposition speed to increase productivity. Accordingly, an embodiment of the present disclosure may be applied to a process of manufacturing a large-size substrate, and particularly, may be applied to a process of manufacturing a display apparatus.

In an experiment performed on the comparative example 1, by applying a gas supply method described in the patent documents 1 and 2, a three-element oxide film including IGZO(InGaZnO) may have been formed on a substrate by supplying the indium source gas, the zinc source gas, and the gallium source gas to the process chamber under a condition shown in the following Table 4.

TABLE 4

| Division | In(DADI) | Zn(DEZ) | Ga(TMGa) |
| --- | --- | --- | --- |
| Flow rate of carrier gas (1) | 1000 sccm | 1000 sccm | 1000 sccm |
| Vapor pressure of source gas (2) | 1.5 Torr | 15 Torr | 300 Torr |
| Pressure of container (3) | 500 Torr | 500 Torr | 500 Torr |
| Flow rate of source gas (4) | 3 sccm | 30 sccm | 600 sccm |
| Density of source gas [(4)/{(1) + (4)}] | 0.29% | 2.9% | 37.5% |

As seen in Table 4, in the comparative example 1, it may be seen that, since a mixed source gas of the indium source gas, the zinc source gas, and the gallium source gas having different vapor pressures is supplied to the process chamber by using a carrier gas having the same condition, there is ten to two hundred times difference between the flow rates of the indium source gas, the zinc source gas, and the gallium source gas, and thus, it may be seen that the gallium source gas has a density which is relatively higher than that of each of the indium source gas and the zinc source gas. Therefore, in the comparative example 1, the composition non-uniformity of the oxide film formed on the substrate occurs due to a flow rate difference and a density difference between source gases. Particularly, unlike an embodiment of the present disclosure, it may be seen that, in the comparative example 1, the flow rates of the indium source gas, the zinc source gas, and the gallium source gas are not controlled to similar flow rates, and due to this, the comparative example 1 cannot be applied to a process of forming an oxide film.

In the comparative example 1, as a result obtained by controlling other conditions so as to identically control the flow rate of each of the indium source gas, the zinc source gas, and the gallium source gas, the flow rate of each of the indium source gas, the zinc source gas, and the gallium source gas having a vapor pressure of several to tens Torr may be identically controlled by individually controlling a flow rate of the carrier gas as in the following Table 5. However, it is impossible to control the flow rate of the gallium source gas having a vapor pressure of hundreds Torr by controlling only the flow rate of the carrier gas, and in a case where the flow rate of the carrier gas is set to a lowest limit value and the pressure of the container is controlled in terms of the uniformity of an oxide film, the flow rate of the carrier gas may be controlled identical to the flow rate of each of the indium source gas and the zinc source gas. However, the pressure of the container is difficult to maintain a normal pressure (760 Torr) or more, and a separate apparatus is needed for maintaining the pressure of the container as the normal pressure.

Therefore, in comparison with an embodiment of the present disclosure, it may be seen that, in the comparative example 1, it difficult to control the flow rates of the indium source gas, the zinc source gas, and the gallium source gas to similar flow rates.

In an experiment performed on the comparative example 2, a three-element oxide film including IGZO(InGaZnO) may have been formed on a substrate by supplying the indium source gas and the zinc source gas to the process chamber by using a carrier gas under a condition shown in the following Table 5 and by supplying the gallium source gas to the process chamber by using a flow rate control member instead of the carrier gas.

TABLE 5

| Division | In(DADI) | Zn(DEZ) | Ga(TMGa) |
| --- | --- | --- | --- |
| Flow rate of carrier gas (1) | 1000 sccm | 500 sccm | 0 sccm |
| Vapor pressure of source gas (2) | 1.5 Torr | 15 Torr | 300 Torr |
| Pressure of container (3) | 100 Torr | 500 Torr | 300 Torr |
| Flow rate of source gas (4) | 15 sccm | 15 sccm | 15 sccm |
| Density of source gas [(4)/{(1) + (4)}] | ~1.5% | ~2.9% | 100% |

As seen in Table 5, in the comparative example 2, it may be seen that, since the indium source gas and the zinc source gas are supplied to the process chamber by using an individual carrier gas and the gallium source gas is supplied to the process chamber by using the flow rate control member, the flow rate of each of the indium source gas, the zinc source gas, and the gallium source gas is identically controlled. However, in the comparative example 2, since the gallium source gas has a relatively high vapor pressure, the flow rate of the gallium source gas may be controlled identical to the flow rate of each of the indium source gas and the zinc source gas through flow rate control by the flow rate control member without the carrier gas, but since a density of the gallium source gas is 100%, the composition non-uniformity of the oxide film formed on the substrate occurs due to a density difference between source gases. Particularly, in the comparative example 2, a purge process performed for a sufficient time (about ten seconds) is needed for uniformly adsorbing a gallium source precursor having a high density onto the substrate, and thus, due to the purge process, a deposition speed is reduced, causing the reduction in productivity. For this reason, the comparative example 2 cannot be applied to a process of manufacturing a large-size substrate (particularly, a process of manufacturing a display apparatus).

By using a manufacturing method according to an embodiment of the present disclosure and a manufacturing method of the comparative example 2, an oxide film may have been formed on a substrate, and the following Table 6 shows a result obtained by measuring a composition of an oxide film formed in each of a center region (center) of the substrate and an inner region (inside) between the center region and an outer region. In this case, an inductive coupling plasma optical emission spectroscopy (ICP-OES) may have been used for a composition measurement of an oxide film. The ICP-OES may be an apparatus which obtains and analyzes an emission spectrum of an element by using inductive coupling plasma capable of obtaining a high temperature of about 10,000K.

TABLE 6

| Division | | Film composition (at. %) | | | |
| --- | --- | --- | --- | --- | --- |
| | | In | Ga | Zn | Δ |
| Comparative example 2 | Center | 22.5 | 52.5 | 24.9 | 8.0% |
| | Inside | 24.7 | 44.5 | 30.8 | |
| Embodiment of the present disclosure | Center | 23.1 | 49.4 | 27.4 | 1.5% |
| | Inside | 24.5 | 49.6 | 25.9 | |

As seen in Table 6, in the method of manufacturing an oxide film according to the comparative example 2, it may be seen that a gallium density deviation between the center region (center) and the inner region (inside) of the substrate is 8%. On the other hand, in the method of manufacturing an oxide film according to an embodiment of the present disclosure, it may be seen that a gallium density deviation between the center region (center) and the inner region (inside) of the substrate is 1.5%.

The apparatus and method of manufacturing an oxide film according to an embodiment of the present disclosure may improve the composition uniformity of a three-element oxide film including IGZO(InGaZnO), and moreover, may improve the composition uniformity of the above-described two-element oxide film or four-element oxide film.

Figure 9:
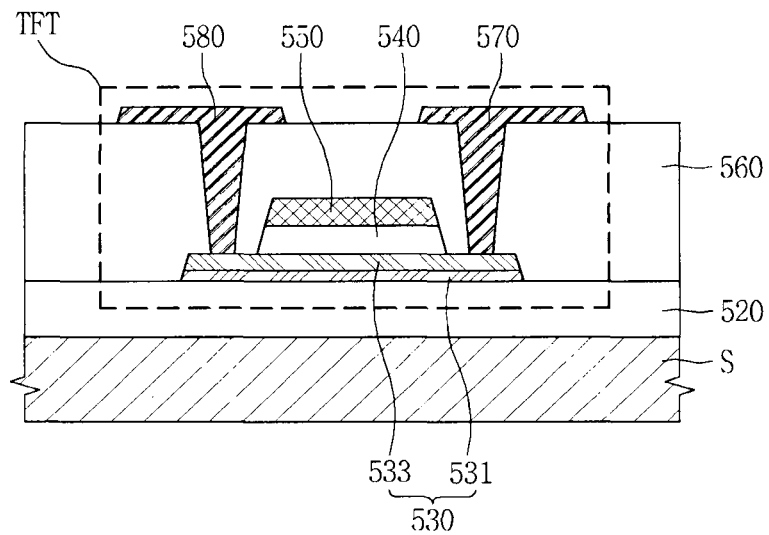
FIG. 9 is a cross-sectional view of a thin film transistor according to an embodiment of the present disclosure.

FIG. 9 is a cross-sectional view of a thin film transistor TFT according to an embodiment of the present disclosure.

Referring to FIG. 9, the thin film transistor TFT according to an embodiment of the present disclosure may include an oxide semiconductor layer 530 on a substrate S, a gate electrode 550 which is insulated from the oxide semiconductor layer 530 and overlaps at least a portion of the oxide semiconductor layer 530, a source electrode 570 which is connected to the oxide semiconductor layer 530, and a drain electrode 580 which is spaced apart from the source electrode 570 and is connected to the oxide semiconductor layer 530.

The substrate S may use glass or plastic. The plastic may use transparent plastic having a flexible characteristic, and for example, may use polyimide.

A front surface of the substrate S may be covered by a buffer layer 520. The buffer layer 520 may include at least one of silicon oxide and silicon nitride.

The buffer layer 520 may include hydrogen (H). Hydrogen included in the buffer layer 520 may move to the oxide semiconductor layer 530 and may be bonded to oxygen of the oxide semiconductor layer 530, causing oxygen vacancy (O-vacancy) in the oxide semiconductor layer 530 or causing the oxide semiconductor layer 530 to have conductivity. Due to this, the oxide semiconductor layer 530 may be damaged, causing the reduction in reliability of the thin film transistor TFT.

The oxide semiconductor layer 530 may include a hydrogen blocking layer 531 on the buffer layer 520 and an active layer 533 on the hydrogen blocking layer 531.

The hydrogen blocking layer 531 may be disposed between the active layer 533 and the buffer layer 520 and may prevent hydrogen (H) from flowing into the active layer 530, thereby acting as a passivation layer for protecting the active layer 533.

The hydrogen blocking layer 531 according to an embodiment may include gallium (Ga) and zinc (Zn).

Gallium (Ga) may form a stable bond to oxygen, and thus, may be good in resistance to penetration of a gaseous material. Therefore, hydrogen may be blocked by a surface of the hydrogen blocking layer 531 and may not be bonded to gallium, and thus, may not be diffused to the hydrogen blocking layer 531.

Zinc (Zn) may contribute to stable forming of a layer. An amorphous layer or a crystalline layer may be easily formed by zinc. Accordingly, gallium may form a stable layer along with zinc.

The hydrogen blocking layer 531 according to an embodiment may include an oxide semiconductor material such as GZO(GaZnO). The oxide semiconductor material such as GZO(GaZnO) may be a metal component and may be a semiconductor material including gallium and zinc. Also, the hydrogen blocking layer 531 may include a small amount of indium (In). For example, indium of the active layer 533 may flow into the hydrogen blocking layer 531, and thus, the hydrogen blocking layer 531 may include indium. The hydrogen blocking layer 531 may be formed to have a composition having a hydrogen blocking function, based on the method of manufacturing an oxide film by using the oxide film manufacturing apparatus using the MOCVD process according to an embodiment of the present disclosure illustrated in FIGS. 1 to 8.

The active layer 533 may be referred to as a channel layer. The active layer 533 may include an oxide semiconductor material. For example, the active layer 132 may include an oxide semiconductor material such as IZO(InZnO), IGO (InGaO), GZO(GaZnO), IGZO(InGaZnO), GZTO (GaZnSnO), ITZO(InSnZnO), or IGZTO(InGaZnSnO). The active layer 533 may be formed to have a composition suitable for a characteristic of the thin film transistor TFT, based on the method of manufacturing an oxide film by using the oxide film manufacturing apparatus using the MOCVD process according to an embodiment of the present disclosure illustrated in FIGS. 1 to 8.

The oxide semiconductor layer 530 may be covered by an insulation layer 540. The insulation layer 540 may include at least one of silicon oxide and silicon nitride.

The gate electrode 550 may be disposed on the insulation layer 540 of which at least a portion overlaps the oxide semiconductor layer 530.

The gate electrode 550 and the oxide semiconductor layer 530 may be covered by an interlayer insulation layer 560. The interlayer insulation layer 560 may include an organic material or an inorganic material, or may be formed as a stacked body of an organic material layer and an inorganic material layer.

The source electrode 570 and the drain electrode 580 may be disposed on the interlayer insulation layer 560 to overlap the oxide semiconductor layer 530, spaced apart from each other, and connected to the oxide semiconductor layer 530.

The source electrode 570 may be connected to the oxide semiconductor layer 530 (i.e., a source region of the active layer 533) through a source contact hole formed in the interlayer insulation layer 560. The drain electrode 580 may be connected to the oxide semiconductor layer 530 (i.e., a drain region of the active layer 533) through a drain contact hole formed in the interlayer insulation layer 560.

The thin film transistor TFT according to an embodiment of the present disclosure may include the oxide semiconductor layer 530 which is formed based on the method of manufacturing an oxide film by using the oxide film manufacturing apparatus using the MOCVD process according to an embodiment of the present disclosure, thereby improving an electrical characteristic based on a uniform composition of the oxide semiconductor layer 530.

Figure 10:
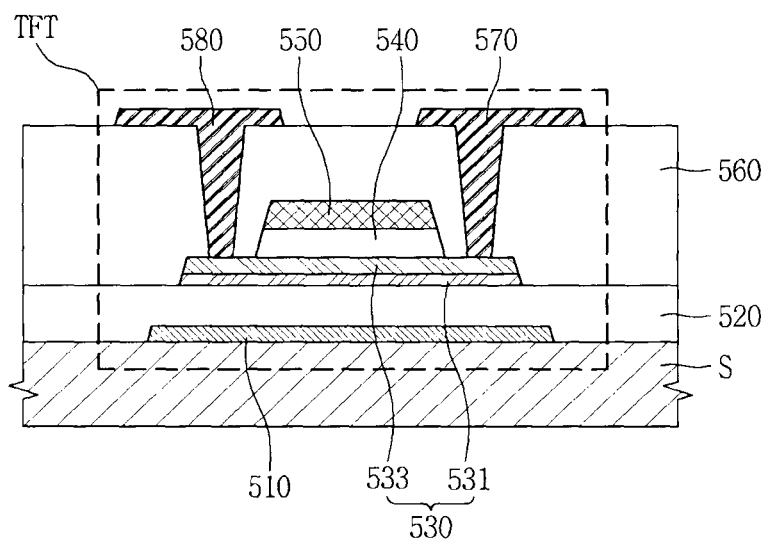
FIG. 10 is another cross-sectional view of a thin film transistor according to an embodiment of the present disclosure.

Additionally, as illustrated in FIG. 10, the thin film transistor TFT according to an embodiment of the present disclosure may further include a light blocking layer 510 disposed between the substrate S and the buffer layer 520.

The light blocking layer 510 may overlap the oxide semiconductor layer 530 to block light incident on the oxide semiconductor layer 530 of the thin film transistor TFT from the outside, thereby preventing the oxide semiconductor layer 530 from being damaged or degraded by external incident light.

The light blocking layer 510 according to an embodiment may include an electrically conductive material such as metal, and thus, the light blocking layer 510 may be covered by the buffer layer 520 so as to insulate the light blocking layer 510 from the oxide semiconductor layer 530. Therefore, hydrogen included in the buffer layer 520 may be diffused to the inside of the oxide semiconductor layer 530, but may be blocked by the surface of the hydrogen blocking layer 531 of the oxide semiconductor layer 530 disposed on the buffer layer 520 overlapping the light blocking layer 510 and may not be bonded to gallium, thereby preventing hydrogen of the buffer layer 520 from being diffused to the hydrogen blocking layer 531.

Additionally, the thin film transistor TFT illustrated in FIGS. 9 and 10 may have a top gate structure where a gate electrode is disposed on the oxide semiconductor layer 530, but without being limited thereto, may have a bottom gate structure where the gate electrode is disposed under the oxide semiconductor layer 530.

Figure 11:
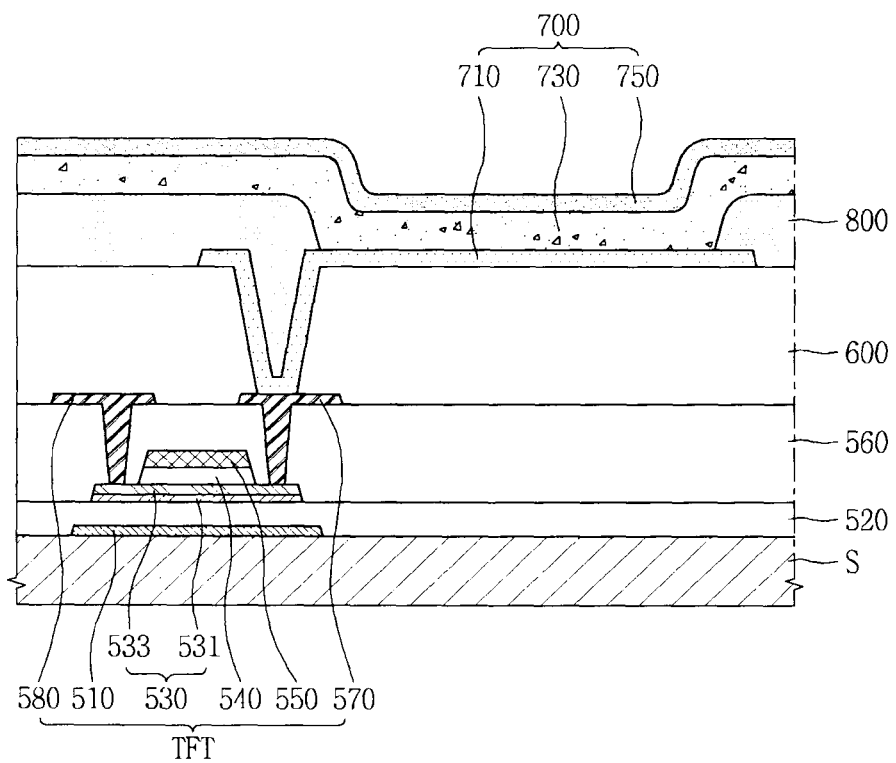
FIG. 11 is a schematic cross-sectional view of a display apparatus according to an embodiment of the present disclosure.

FIG. 11 is a schematic cross-sectional view of a display apparatus according to an embodiment of the present disclosure.

Referring to FIG. 11, the display apparatus according to an embodiment of the present disclosure may include a substrate S, a thin film transistor TFT, a planarization layer 600, an organic light emitting device 700, and a bank layer 800. Here, the organic light emitting device 700 may include a first electrode 710, an organic layer 730, and a second electrode 750.

The substrate S and the thin film transistor TFT are respectively the same as the substrate S and the thin film transistor TFT each illustrated in FIG. 9 or 10, and thus, their repetitive descriptions are omitted. The display apparatus according to an embodiment of the present disclosure may further include a gate line, which is formed along with a gate electrode 540 of the thin film transistor TFT, and a data line and a pixel driving power line which are each formed along with a source electrode 570 and a drain electrode 580 of the thin film transistor TFT.

The planarization layer 600 may be disposed on the thin film transistor TFT to planarize an upper surface of the substrate S. The planarization layer 600 may include an organic insulating material such as acryl resin having photosensitivity, but is not limited thereto.

The first electrode 710 may be disposed on the planarization layer 600. The first electrode 710 may be connected to the source electrode 570 of the thin film transistor TFT through an electrode contact hole included in the planarization layer 600.

The bank layer 800 may be disposed on the first electrode 710 and the planarization layer 600 to define an emissive area of each of a plurality of pixels. The bank layer 800 according to an embodiment may be disposed in a matrix structure in a boundary region between the plurality of pixels to define the emissive area of each pixel.

The organic layer 730 may include an organic light emitting layer.

The organic layer 730 according to an embodiment may include one organic light emitting layer which emits light having one color of red, green, and blue. In this case, the organic layer 730 may be disposed on the first electrode 710 which is disposed in the emissive area defined by the bank layer 800 so as to be divided by units of pixels.

According to another embodiment, the organic layer 730 may include a plurality of organic light emitting layers which are vertically stacked to emit lights of different colors, for emitting white light. In this case, the organic layer 730 may be disposed on the first electrode 710 and the bank layer 800 so as to be connected between adjacent pixels without being divided by units of pixels.

The second electrode 750 may be disposed on the substrate S and may be connected to the organic layer 730 disposed in each of the plurality of pixels in common.

Optionally, in a case where the organic layer 730 emits white light, each of the plurality of pixels may include a color filter for filtering, by units of wavelengths, the white light emitted from the organic layer 730. The color filter may be provided in a light movement path.

For example, in a bottom emission type where light emitted from the organic layer 730 is output to the outside through the substrate S, the color filter may be disposed under the organic layer 730 to overlap the emissive area of each pixel. In this case, the first electrode 710 may be formed as a transparent conductive layer and may include the transparent conductive layer which is formed based on the method of manufacturing an oxide film by using the oxide film manufacturing apparatus using the MOCVD process according to an embodiment of the present disclosure.

As another example, in a top emission type where the light emitted from the organic layer 730 is output to the outside through the second electrode 750, the color filter may be disposed on the organic layer 730 to overlap the emissive area of each pixel. In this case, the second electrode 750 may be formed as a transparent conductive layer and may include the transparent conductive layer which is formed based on the method of manufacturing an oxide film by using the oxide film manufacturing apparatus using the MOCVD process according to an embodiment of the present disclosure.

The display apparatus according to an embodiment of the present disclosure, as illustrated in FIG. 11, may have a structure of an organic light emitting display apparatus including the organic light emitting device 700, but without being limited thereto, may have a structure of a liquid crystal display apparatus including a liquid crystal layer.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the scope of the disclosure. Thus, it is intended that the present disclosure covers the modifications and variations of this disclosure provided they come within the scope of the appended claims.

What is claimed is:

1. A method of manufacturing an oxide film, the method comprising:
   loading a substrate into a process chamber;
   generating a first source gas having a first vapor pressure using a first source container module that is connected to an intermediate connection point that is external to the process chamber, the intermediate connection point connected to a first gas injection port of the process chamber;
   generating a second source gas having a second vapor pressure that is different from the first vapor pressure using a second source container module that is connected to the intermediate connection point, the second source gas supplied to the intermediate connection point based on the second vapor pressure of the second source gas;
   supplying a first carrier gas to the first source container module such that the first source gas and the first carrier gas are supplied to the intermediate connection point responsive to the first carrier gas being supplied to the first source container module;
   supplying a force gas to the intermediate connection point via a gas path that is between the second source container module and the intermediate connection point, the force gas not supplied to the second source container module;
   generating a mixed gas at the intermediate connection point that includes the first source gas, the second source gas, the first carrier gas, and the force gas;
   supplying the mixed gas to the process chamber via the first gas injection port, wherein an organic material precursor from the mixed gas is absorbed by the substrate;
   supplying a reactant gas to the process chamber via one or more second gas injection ports of the process chamber after the organic material precursor is absorbed by the substrate;
   generating plasma within the process chamber while the reactant gas is supplied to the process chamber, the plasma activating the reactant gas that is in the process chamber;
   forming the oxide film on the substrate responsive to the activated reactant gas reacting with the organic material precursor that is absorbed by the substrate; and
   supplying a purge gas to the first gas injection port.

2. The method of claim 1, wherein a flow rate of the first source gas supplied to the first gas injection port is controlled by the first carrier gas, and a density of the second source gas supplied to the first gas injection port is controlled by the force gas.

3. The method of claim 1, wherein the second vapor pressure is greater than the first vapor pressure.

4. The method of claim 3, wherein the first vapor pressure is less than 200 Torr, and the second vapor pressure is greater than or equal to 200 Torr.

5. The method of claim 3, wherein the first source gas is supplied to the first gas injection port through a first source gas supply pipe connected to the first source container module and a gas injection pipe connected to the first source gas supply pipe using the first carrier gas,
   wherein the second source gas is supplied to the first gas injection port through a second source gas supply pipe connected to the second source container module and the gas injection pipe connected to the second source gas supply pipe, and
   wherein the force gas is supplied to the second source gas supply pipe.

6. The method of claim 5, wherein a flow rate of the first source gas supplied from the first source container module to the first source gas supply pipe is controlled by a first flow rate control member that is configured to supply the first carrier gas to the first source container module,
   wherein a flow rate of the second source gas supplied from the second source container module to the second source gas supply pipe is controlled by a second flow rate control member installed in the second source gas supply pipe, and
   wherein the force gas is supplied to the second source gas supply pipe through a force gas supply pipe that is closer to the second flow rate control member than the gas injection pipe.

7. The method of claim 5, further comprising:
   generating a third source gas having a third vapor pressure that is different from the second vapor pressure using a third source container module that is connected to the first gas injection port; and
   supplying a second carrier gas to the third source container module such that the third source gas is supplied to the first gas injection port via the second carrier gas,
   wherein a flow rate of the third source gas that is supplied to the first gas injection port is controlled by the second carrier gas, and
   wherein the distribution of the first source gas, the second source gas, the reactant gas, and the purge gas comprises distributing the third source gas to the substrate.

8. The method of claim 7, further comprising:
   generating a fourth source gas having a fourth vapor pressure that is different from the second vapor pressure using a fourth source container module connected to the first gas injection port; and
   supplying a third carrier gas to the fourth source container module such that the fourth source gas is supplied to the first gas injection port via the third carrier gas,
   wherein a flow rate of the fourth source gas that is supplied to the first gas injection port is controlled by the third carrier gas, and
   wherein the distribution of the first source gas, the second source gas, the reactant gas, and the purge gas comprises distributing the fourth source gas to the substrate.

9. The method of claim 1,
   wherein the second source container module that lacks an input port to the force gas supply module.

10. The method of claim 9, further comprising:
    injecting the second source gas into the process chamber via the first gas injection port.

11. The method of claim 1, wherein the reactant gas comprises oxygen ($O_2$).

12. The method of claim 11,
    the reactant gas is changed to a plasmatic reactant gas using the plasma, and the plasmatic reactant gas is distributed to the substrate.

13. The method of claim 1, wherein the reactant gas comprises ozone ($O_3$) or water vapor ($H_2O$).

14. The method of claim 1, wherein the first source gas comprises one material of diethylzinc (DEZn), triisobutylgallium (TIBGa), triethylgallium (TEGa), triethylindium (TEIn), trimethylindium (TMIn), and (3-dimethylaminopropyl)dimethylindium (DADI), and
   wherein the second source gas comprises trimethylgallium (TMGa) or dimethylzinc (DMZn).

15. The method of claim 7, wherein the first source gas comprises one material of (3-dimethylaminopropyl)dimethylindium (DADI), triethylindium (TEIn), and trimethylindium (TMIn),
- wherein the second source gas comprises dimethylzinc (DMZn), and
- wherein the third source gas comprises tetraethyltin (TESn) or tetramethyltin (TMSn).

16. The method of claim 15, wherein each of the first source gas, the second source gas, and the third source gas is distributed to the substrate for a process time equal to or less than one second.

17. The method of claim 8, wherein the first source gas comprises one material of diethylzinc (DEZn), triisobutylgallium (TIBGa), and triethylgallium (TEGa),
- wherein the second source gas comprises trimethylgallium (TMGa) or dimethylzinc (DMZn),
- wherein the third source gas comprises one material of (3-dimethylaminopropyl)dimethylindium (DADI), triethylindium (TEIn), and trimethylindium (TMIn), and
- the fourth source gas comprises tetraethyltin (TESn) or tetramethyltin (TMSn).

18. The method of claim 17, wherein each of the first source gas, the second source gas, the third source gas, and the fourth source gas is distributed to the substrate for a process time equal to or less than one second.

* * * * *